(12) United States Patent
Nozaki et al.

(10) Patent No.: US 8,334,091 B2
(45) Date of Patent: Dec. 18, 2012

(54) RESIST PATTERN SWELLING MATERIAL, AND METHOD FOR PATTERNING USING SAME

(75) Inventors: Koji Nozaki, Kawasaki (JP); Miwa Kozawa, Kawasaki (JP); Takahisa Namiki, Kawasaki (JP); Junichi Kon, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/213,820

(22) Filed: Jun. 25, 2008

(65) Prior Publication Data

US 2008/0274431 A1 Nov. 6, 2008

Related U.S. Application Data

(60) Division of application No. 10/408,735, filed on Apr. 7, 2003, now abandoned, which is a continuation of application No. PCT/JP02/08224, filed on Aug. 12, 2002.

(30) Foreign Application Priority Data

Aug. 10, 2001 (JP) ................................ 2001-245082
Aug. 7, 2002 (JP) ................................ 2002-230427

(51) Int. Cl.
*G03F 7/00* (2006.01)

(52) U.S. Cl. .................... 430/273.1; 430/313; 430/156; 430/942

(58) Field of Classification Search .............. 430/273.1, 430/313, 156, 942
See application file for complete search history.

(56) References Cited

U.S. PATENT DOCUMENTS

| | | | |
|---|---|---|---|
| 4,668,758 A | | 5/1987 | Corley |
| 4,778,767 A | * | 10/1988 | Hummelen et al. .......... 436/531 |
| 5,858,620 A | | 1/1999 | Ishibashi et al. |
| 5,932,391 A | * | 8/1999 | Ushirogouchi et al. ... 430/270.1 |
| 6,017,675 A | | 1/2000 | Dietliker et al. |
| 6,228,552 B1 | * | 5/2001 | Okino et al. .................. 430/176 |
| 6,319,853 B1 | | 11/2001 | Ishibashi et al. |
| 6,372,689 B1 | | 4/2002 | Kuga et al. |
| 6,537,718 B2 | | 3/2003 | Nishiyama et al. |
| 6,537,719 B1 | | 3/2003 | Takahashi |
| 6,569,778 B2 | * | 5/2003 | Lee et al. ...................... 438/734 |
| 6,579,657 B1 | | 6/2003 | Ishibashi et al. |
| 6,964,839 B1 | | 11/2005 | Choi et al. |
| 2001/0031423 A1 | | 10/2001 | Kita |
| 2003/0157801 A1 | | 8/2003 | Kozawa et al. |

FOREIGN PATENT DOCUMENTS

| | | |
|---|---|---|
| CN | 1222756 A | 7/1999 |
| DE | 198 43 179 A1 | 7/1999 |
| DE | 100 14 083 A1 | 3/2001 |
| EP | 1 152 036 A1 | 11/2001 |
| EP | 1 160 083 A2 | 12/2001 |
| EP | 1 162 078 A2 | 12/2001 |
| EP | 1 223 470 A1 | 7/2002 |
| JP | 6-250379 | 9/1994 |
| JP | 10-73927 | 3/1998 |
| JP | 11-204399 A | 7/1999 |
| JP | 2001-19860 A | 1/2001 |
| JP | 2001-100428 | 4/2001 |
| KR | 2001-0047840 A | 6/2001 |
| WO | WO 01/25854 A1 | 4/2001 |

OTHER PUBLICATIONS

"Design of cycloolefin-maleic anhydride resist for ArF lithography", Proc SPIE, vol. 3333, pp. 11-25, Feb. 1998.*
Korean Office Action dated Aug. 19, 2008 of KR 10-2003-7005078.
Chinese Office Action dated Nov. 28, 2008, issued in corresponding Chinese Application No. 028026322.

* cited by examiner

*Primary Examiner* — Daborah Chacko Davis
(74) *Attorney, Agent, or Firm* — Westerman, Hattori, Daniels & Adrian, LLP

(57) ABSTRACT

To provide a method for easily forming microscopic patterns exceeding the limit of exposure in the patterning technique utilizing the photolithography method in the vacuum deep ultraviolet ray region, a resist pattern swelling material is comprised by mixing a water-soluble or alkali-soluble composition comprising a resin and a cross linking agent and any one of a non-ionic interfacial active agent and an organic solvent selected from a group of the alcohol based, chain or cyclic ester based, ketone based, chain or cyclic ether based organic solvents.

15 Claims, 10 Drawing Sheets

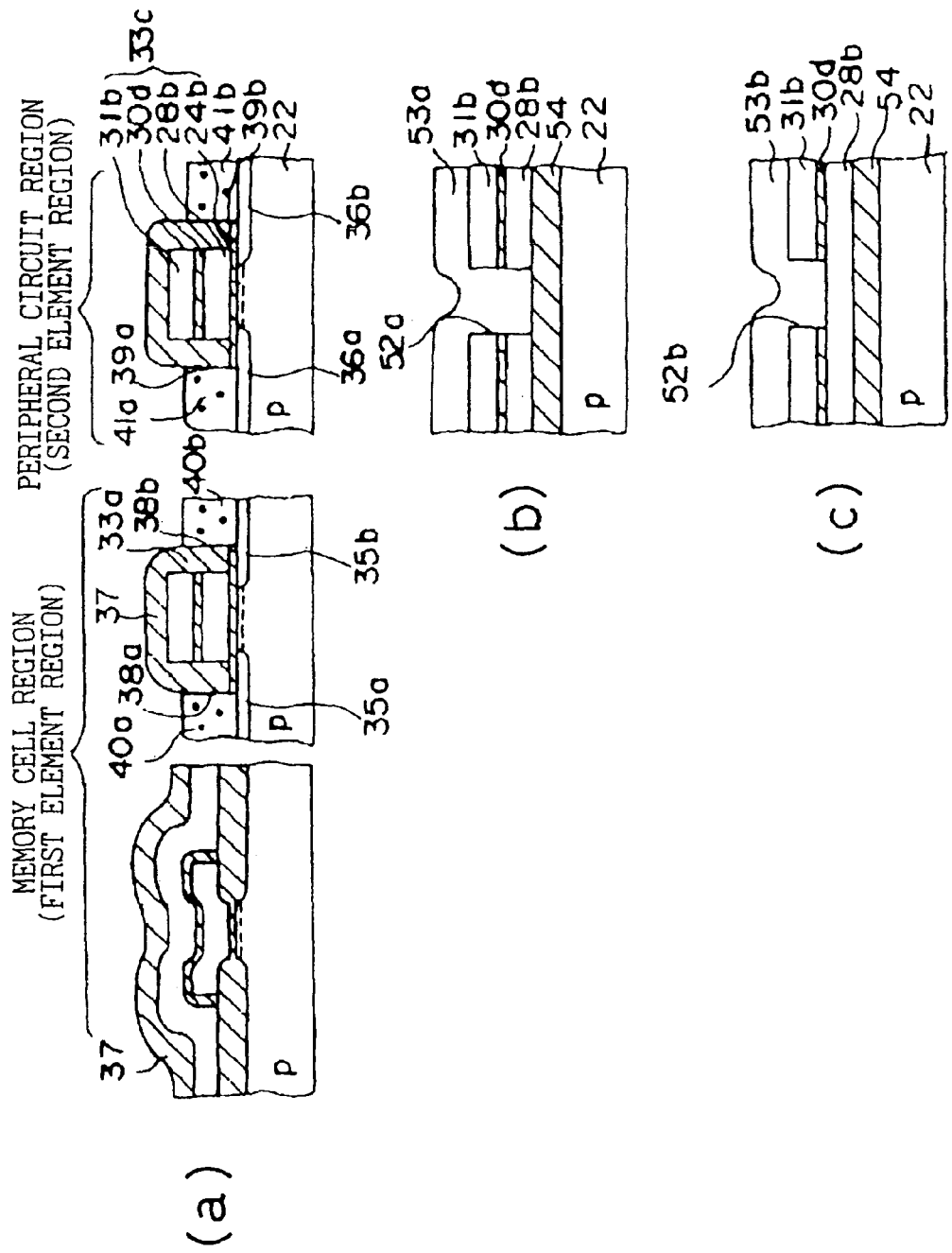

RESIST PATTERN SWELLING MATERIAL, AND METHOD FOR PATTERNING USING SAME

CROSS-REFERENCE TO RELATED APPLICATION

This application is a divisional application of prior application Ser. No. 10/408,735 filed Apr. 7, 2003, which is a continuation Application No. PCT/JP02/08224 filed on Aug. 12, 2002, the benefit of which is claimed under 35 U.S.C. §120.

This application is based upon and claims the benefit of priority from Japanese Patent Applications No. 2001-245082, filed Aug. 10, 2001, and No. 2002-230427, filed Aug. 7, 2002, the entire contents of which are incorporated herein by reference, and a continuation of PCT/JP02/08224, filed Aug. 12, 2002.

BACKGROUND OF THE INVENTION

1. Field of the Invention

The present invention relates to a resist pattern swelling material, a method of forming a microscopic pattern, a method of manufacturing a miniaturized device and a method of manufacturing a semiconductor device and more specifically to a technique for swelling a pattern provided on the resist exceeding the exposure limit by providing a film on the surface of resist pattern formed through the exposure and then swelling the resist pattern through reaction between the resist pattern and the relevant film.

Predominantly because of maintaining high productivity, utilization of light for resist exposure is still highly demanded even at present wherein a pattern tends to become further microscopic size. Therefore, not only investigations have been continued for the deep ultraviolet ray having a shorter wavelength to be used as the exposing light but also various searches have been also been continued for the mask pattern itself and shape of light source or the like. As explained above, new development of a method to easily realize extensive use of the light in the exposure to draw a more microscopic pattern is still highly demanded for the manufacturers of semiconductor devices.

2. Description of Related Art

The deep ultraviolet ray has been put into the practical use as the light to be used for exposing a photo-resist and a microscopic pattern of a certain degree can be drawn through employment of KrF (krypton fluoride) excimer laser beam (wavelength: 248 nm). Since the technique called 'RELACS' which enables easier drawing of a further microscopic resist pattern by utilizing this KrF (krypton fluoride) is already proposed, this method will be introduced below.

Japanese Unexamined Patent Publication (Kokai) No. 10-73927, published on Mar. 17, 1998, discloses a method. In this method, a resist pattern is first obtained by exposing the photoresist which may be exposed with the KrF (krypton fluoride) excimer laser beam. Next, a film is formed to cover the relevant resist pattern and this film reacts with a resist material at the interface thereof. Thereby, the resist material is swelled and a microscopic hole, for example, in the case of a hole pattern, can be formed exceeding the limitation of exposure. The related art explained above discloses that any type of positive or negative resist materials can be used, a novolak resin and a photosensitive agent based on naphthoquinone diazido may be listed and a chemical amplification type resist including acid generation mechanism can also be applied. This related art also discloses that polyacrylic acid, polyvinyl acetal, polyvinyl pyrrolidone, polyvinyl alcohol, polyethylene imine, polyethyleneoxydo, sthylene-maleic acid copolymer, polyvinyl amine resin, polyallylamine, water-soluble resin containing oxazoline group, water-soluble melamine resin, water-soluble urea resin, alkyd resin, sulfone amide resin or the like are effective in regard to the resin compositions used to form a film, any limitation is not provided when mixing with a water-soluble cross linking agent is possible if cross linking reaction is generated or not generated under the existence of an acidic element, and these material listed above can also be used as a discrete material or mixed material. In addition, the related art explained above also discloses that the cross linking agents based on urea such as urea, alcoxymethylene urea, N-alcoxymethylene urea, ethylene urea, ethylene urea calbonic acid, the cross linking agents based on amine such as benzoguanamine and glucore can be used as the cross linking agent to form a film, but there is no particular limitation to the cross linking agent based on amine and any type of a water-soluble cross linking agent which forms a cross linking with acid can be used.

SUMMARY OF THE INVENTION

The aforementioned related art seems to be easily applied by manufacturers, but such expectation for the effect of swelling of resist pattern through combination of the materials listed above is possible only up to the exposure utilizing the KrF (krypton fluoride) excimer laser beam, and it has been discovered by the inventors of the present invention that any effect cannot be attained even when the technique of the related art explained above is employed for the laser beam of shorter wavelength.

For the ArF (argon fluoride) excimer laser beam (wavelength: 193 nm) which has already been put into the practical use as the laser beam of the next generation after the KrF (krypton fluoride) excimer laser beam (wavelength: 248 nm), it is impossible to employ a resin composition based on aromatic group such as the novolac resin because the aromatic cycle itself intensively absorbs the ultraviolet ray in the wavelength shorter than that of the ArF (argon fluoride) excimer laser beam and thereby the resist film does not transmit the exposing laser beam. Therefore, in the generation of the laser beam after the ArF (argon fluoride) excimer laser beam, a new composition not containing the aromatic cycle has to be employed as the resist composition and therefore reaction for the swelling of pattern does not progress even when a film of the composition disclosed in the related art explained above is formed to such a quite new resist composition.

As explained above, the aforementioned related art cannot provide the swelling effect of pattern for the laser beam of the wavelength shorter than that of the ArF (argon fluoride) excimer laser beam (wavelength: 193 nm). Namely, an object of the present invention is establishment of the technique which can introduce a pattern swelling method into the exposure with the ArF (argon fluoride) excimer laser beam by forming a film to the resist film after formation of the pattern like the RELACS technique of the related art.

In view of solving the problems in the related art, the present invention provides, e.g., following means.

(1) A swelling material formed by coating to cover the surface of a resist pattern is constructed by containing a resin composition consisting of at least a kind of resin selected from polyvinyl alcohol, polyvinyl acetal and polyvinyl acetate, a water-soluble composition including at least a cross linking agent selected from a group of the cross linking agents consisting of melamine derivative, urea derivative and ulyl derivative and at least an interfacial active agent selected from a group of the polyoxyethylene-polyoxypropylene condensation product based, polyoxyalkylenealkylether based, polyoxyethylenealkylether based, polyoxyethylene derivative based, sorbitan fatty acid ester based, glycerine fatty acid ester based, primary alcohol ethoxylate based and phenolethoxylate based interfacial active agents.

(2) A swelling material formed by coating to cover the surface of the resist pattern is comprised from a resin composition consisting of at least a kind of resins selected from polyvinyl alcohol, polyvinyl acetal and polyvinyl acetate, a water-soluble composition including at least a kind of the cross linking agents selected from a group of the cross linking agents consisting of melamine derivative, urea derivative and uryl derivative and at least a kind of phenol based resin.

(3) A swelling material formed by coating to cover the surface of the resist pattern is comprised from a phenol resin, at least a kind of cross linking agent selected from a group of the cross linking agents consisting of melamine derivative, urea derivative and uryl derivative and a solvent which does not easily dissolve a pattern resist as the under layer.

(4) A resist pattern swelling method in which any one of the swelling materials described in the items (1) to (3) is coated to cover the surface of the relevant resist pattern after this resist pattern is formed. Or a method of forming a microscopic pattern employing the above resist pattern swelling method. Or a method of manufacturing a miniaturized device employing the above resist swelling method. Or a method of manufacturing a semiconductor device employing the above resist pattern swelling method.

(5) A method of swelling a resist pattern comprising the steps of coating the surface of the relevant resist pattern, after formation of the resist pattern, with a aqueous solution containing an interfacial active agent selected from a group of the polyoxyethylene-polyoxypropylene condensation product based, polyoxyalkylenealykylether based, polyoxy-ethylene-alkylether based, polyoxyethylene derivative based, sorbitan fatty acid ester based, glycerine fatty acid ester based, primary alcohol ethoxylate based and phenol ethoxylate based interfacial active agents, and then coating the surface of the resist pattern with a resin composition consisting of at least a kind of the resins selected from polyvinyl alcohol, polyvinyl acetal and polyvinyl acetate and with a water-soluble composition including at least a kind of cross linking agent selected from a group of the cross linking agents consisting of melamine derivative, urea derivative and uryl derivative. Or a method of forming a microscopic pattern employing the above resist pattern swelling method. Or a method of manufacturing a miniaturized device employing the above resist pattern swelling method. Or a method of manufacturing a semiconductor device employing the above resist pattern swelling method.

Next, operation and principle of the present invention will be explained.

According to the finding of the inventors of the present invention, the effect of swelling of pattern cannot be obtained for the ArF (argon fluoride) excimer laser beam because it can be assumed that when a photoresist composition corresponding to the ArF excimer laser beam is used, affinity between the film formed by coating to accelerate the swelling after formation of the photoresist pattern and the photoresist pattern as the foundation layer, unlike the situation that the photoresist corresponding to the KrF excimer laser beam is used is remarkably deteriorated. Therefore, the concept of the present invention can be attained by the invention to adjust the composition of the film in order to improve the affinity between the photoresist pattern corresponding to the ArF excimer laser beam as the lower layer and the film formed as the upper layer.

In the related art, a pattern is swelled depending on the cross linking reaction due to the diffusion of acid, but according to the pattern swelling technique of the present invention, it can be easily supposed that such cross linking reaction resulting from diffusion of acid disclosed in the related art is not utilized because the pattern swelling effect, which can be assured through application of this technique into the wafer immediately after the exposure thereof, has also been detected in the wafer even when it has been left at the outside of the clean room for about a month after the exposure thereof. In the present invention, it can also be supposed that such swelling effect can be attained depending on the phase-solubility of resin between the resist pattern and swelling film.

In more detail, in the example of item (1), since a film is formed on the surface of the resist pattern with a material obtained by mixing the particular cross linking agent and the particular interfacial active agent into the particular resin composition, the interfacial active agent within the film can improve affinity with the resist pattern surface and thereby the sufficient pattern swelling effect of the material can be attained.

In the example of item (2), since a film is formed on the resist pattern surface with a material obtained by adding the particular cross linking agent and a resin material known as the existing resist material into the particular resin composition, the existing resist material in the film reacts with the resist pattern surface and dissolves a little the pattern surface to improve the affinity with the resist pattern surface and thereby sufficient pattern swelling effect of the material can be assured.

In the example of item (3), since a film is formed on the resist pattern surface with inclusion of the resin material known as the existing resist material, the particular cross linking agent and the solvent which does not easily dissolves the resist pattern, the solvent reacts with the resist pattern surface to dissolve the surface a little to improve the affinity with the resist pattern surface and thereby sufficient pattern swelling effect of the material can be assured.

In the example of item (5), the affinity of the resist pattern surface is improved with an aqueous solution including the interfacial active agent and subsequently the resist pattern surface is coated with a water-soluble composition including the particular resin and the particular cross linking agent. Thereby, the affinity of the resist pattern surface can be improved by formation of the pattern swelling material through the coating thereof and sufficient swelling effect can be assured.

There is explained below the experiments which have been conducted by the inventors of the present invention to presume the cause of the novel problems explained above, in other words, the event considered as the cause that the affinity between the film formed by the coating of material after formation of the photoresist pattern to promote the swelling effect and the photoresist pattern as the foundation layer is extraordinarily deteriorated in the ArF resist.

As the fundamental conditions to vary the resist composition and pattern swelling film material, a material containing a resin including polyvinyl alcohol and polyvinyl acetal in the weight ratio of 8:2, a cross linking agent and an interfacial active agent is formed by coating as a resist pattern swelling film to cover the entire surface of a positive resist pattern where hole patterns are opened. In this case, it is enough to use the well known spin-coating method to form a film and it is preferable that the film thickness is at least about 1000 Å or more preferably about 2000 to 5000 Å.

As an example of the positive resist material in above explanation;

(a) After a polyvinyl phenol type resist based on the annealing is developed with the amount of exposure of 50 mJ/cm$^2$, it has been formed in the thickness of 5060 Å. In this case, after the pattern swelling film is formed by the coating, thickness is increased up to 5260 Å by 4% and therefore it can be assumed that the pattern is surely swelled.

(b) After a polyvinyl phenol type resist based on the acetal is developed with the amount of exposure of 50 mJ/cm$^2$, it has been formed in the thickness of 4770 Å. In this case, the pattern is surely swelled. In more practical, after the pattern swelling film is formed by the coating, the thickness has been increased up to 5270 Å by 11%.

(c) Meanwhile, when a resist corresponding to the exposure by the ArF excimer laser beam based on the acryl including adamantyl in the chain side, after it is developed in the amount of exposure of 50 mJ/cm$^2$, it has been formed in the thickness of 3930 Å. In this case, the pattern is not swelled and after the pattern swelling film is formed, the thickness has been rather reduced to 3880 Å by 1.3%. Unlike the cases of (a) and (b), it can be thought in the item (c) as the cause of no swelling effect for the pattern that the phase-solubility of resin is rather low and affinity with the resist cannot be attained. In general, it has been proved that swelling of pattern is not generated for the resist using the resin based on alicyclic group and thickness thereof is rather reduced.

Next, in the case of item (a), when the amount of exposure is set to 50 mJ/cm$^2$ under the condition that the baking before the exposure and baking after the exposure are respectively conducted at 130° C. and 140° C., the thickness of 4580 Å immediately after the development has been increased up to 4740 Å by 3.5% when the pattern is left for two minutes after the reaction with the resist pattern swelling film. When the pattern is baked after the exposure under the same condition, the thickness has been increased up to 4680 Å but this thickness has been further increased up to 4840 Å by 3.4% when it is left for two minutes after the reaction with the resist pattern swelling film.

In the case of item (b), when the amount of exposure is set to 50 mJ/cm$^2$ under the condition that the baking before the exposure and the baking after the exposure are respectively conducted at 110° C. and 70° C., the thickness of 4550 Å after the development is increased to 4850 Å by 6.6% when it is left for two minutes after the reaction with the resist pattern swelling film. When the baking after the exposure is conducted under the same condition, the thickness of 4680 Å is increased up to 4770 Å by 1.9% when it is left for two minutes after the reaction with the resist pattern swelling film.

Meanwhile, unlike the swelling of pattern in the items (a) and (b), when the amount of exposure is set to 50 mJ/cm$^2$ under the condition that the baking before the exposure and the baking after the exposure are respectively conducted at 110° C. and 115° C., the thickness of 3790 Å after the development is reduced to 3780 Å by 0.3% when it is left for two minutes after the reaction with the rest pattern swelling film. When the baking after the exposure is conducted under the same condition, the thickness of 3840 Å is reduced to 3820 Å by 0.5%.

Following conclusions have been obtained from the facts that thickness is swelled in the items (a) and (b) and thickness is reduced in the item (c) through comparison of the results of (a), (b) and (c). Namely, the phase-solubility is rather good in the resists consisting of resins based on phenol as explained in the items (a) and (b), but the resist pattern swelling effect cannot be obtained in the resist consisting of the resins based on alicyclic group as explained in the item (c) because such phase-solubility cannot be detected.

(Result of Process by Chemical Solution)

On the other hand, even after the process by a kind of chemical solution to which a good solvent of 20 wt % is added is executed before the swelling process by forming through the coating of the pattern swelling film on the resist pattern, increase of the thickness almost cannot be recognized and therefore the swelling effect of the resist pattern by the process with the chemical solution may substantially be neglected. Table 1 shows the result of process with a chemical solution. This table shows change of thickness corresponding to respective processing times for various kinds of chemical solution (aqueous solution).

TABLE 1

Before processing, treatment by using chemical solution adding 20 wt % solvent (2 min.)

| solution | PAR700 after exp. & PEB FT | after 2 min immersion FT | After R500 treatment FT | altering amount | increasing ratio (%) |
|---|---|---|---|---|---|
| 20 wt % GBL | 3600 | 3510 | 3480 | −120 | −3.3 |
| 20 wt % NMP | 3670 | 3660 | 3700 | 30 | 0.8 |
| 20 wt % glyme | 3490 | 3510 | 3490 | 0 | 0 |
| 20 wt % EL | 3730 | 3720 | 3700 | −30 | −0.8 |
| 20 wt % PGME | 3820 | 3830 | 3850 | 30 | −0.8 |
| 20 wt % acetone | 3740 | 3710 | 3700 | −40 | −1.1 |
| 20 wt % dioxane | 3620 | 3640 | 3630 | 10 | 0.2 |
| 5 wt % KS-2010 | 3690 | 3710 | 3700 | 10 | 0.3 |

(Result of Addition of Solvent)

Meanwhile, the inventors have also conducted the experiments to obtain the result by adding various solvents to the pattern swelling film in order to execute the swelling process by forming the pattern swelling film on the resist pattern. Table 2 shows the results of addition of solvents. This table shows changes of thickness depending on the processing times for various kinds of solvents to be added.

TABLE 2

Adding 20 wt % solvent

| adding solvent | PAR700 after exp. & PEB FT | After R500 treatment FT | altering amount | increasing ratio (%) |
|---|---|---|---|---|
| GBL* | 3520 | 3720 | 200 | 5.7 |
| NMP | 3410 | 3350 | −60 | −1.8 |
| glyme | 3460 | 3390 | −70 | −2 |
| EL | 3470 | 3470 | 0 | 0 |
| PGME | 3590 | 3610 | 20 | 0.6 |
| acetone | 3450 | 3450 | 0 | 0 |
| dioxane | 3560 | 3540 | −20 | −0.6 |
| THF | 3600 | 3590 | −10 | −0.3 |
| PGMEA | 3640 | 3610 | −30 | −0.8 |

*GBL is thought to have effect a bit.

According to Table 2, only GBL (γ-butyrolactone) results in distinctive increase of thickness. Here, the GBL (γ-butyrolactone) is different from the other materials in the point that it has a considerably large polarity and it can be presumed that large polarity probably contributes to the swelling effect. Since the butyrolactone generally has large polarity, it give expectation for large swelling effect. Change of the swelling effect depending on change in amount of addition of the GBL (γ-butyrolactone) is shown in Table 3.

TABLE 3

Effect of addition of GBL

| adding amount (wt %) | PAR700 after exp. & PEB FT | After R500 treatment FT | altering amount | increasing ratio (%) | |
|---|---|---|---|---|---|
| 5 | 3470 | 3480 | 10 | 0.3 | |
| 10 | 3620 | 3650 | 30 | 0.8 | |
| 20(*1) | 3610 | 3690 | 80 | 2.2 | * |
| 20(*2) | 3520 | 3630 | 110 | 3.1 | * |

* pattern edges become to be sharpen.
(*1)prepared one day before
(*2)prepared in the same day In Table 3, change of thickness, namely change of the swelling effect respectively for four kinds of amount of addition (wt %) listed in the vertical direction is shown. According to this table, in an example where the GBL (γ-butyrolactone) of only 5 wt % is added to the pattern swelling solution, when the baking process of the resist material forming a pattern is completed after this resist material is exposed to the positive resist based on alicyclic group, the thickness is 3470 Å. However, after this resist pattern is processed using a solution consisting of a mixed solution of polyvinyl alcohol and polyvinyl acetal as the swelling material, the thickness is increased up to 3480 Å showing the increase rate of 10 Å. Namely, the thickness is increased by 0.3% with the swelling process. Similarly, when amount of addition of the GBL (γ-butyrolactone) is increased up to 10 wt %, the thickness of 3620 Å detected when the baking process is completed after the exposure of the resist material forming the pattern (acrylic positive resist including the adamantyl in the chain side) is increased up to 3650 Å showing an increase rate of 30 Å after the resist pattern is processed using the solution consisting of a mixture of polyvinyl alcohol and polyvinyl acetal as the swelling material. Namely, the thickness is increased by 0.8% with the swelling process. Similarly, when amount of addition of the GBL (γ-butyrolactone) is further increased up to 20 wt %, the thickness of 3610 Å detected when the baking process is completed after the exposure of the resist material forming the pattern (acrylic positive resist including adamantyl in the chain side) is increased up to 3690 Å showing amount of change of thickness of 80 Å and increase rate of 2.2% after the swelling process.

FIG. 1 is a graph showing changing rates (%) of thickness of the resist pattern when amount of addition of the GBL is changed.

According to this graph, it can be understood that when amount of addition of the GBL (γ-butyrolactone) increased, alteration of thickness of the resist pattern becomes distinctive and therefore the swelling effect of pattern can be enhanced.

(Discussion for Interfacial Active Agent: Part 1)

Next, an interfacial active agent to construct a pattern swelling material through the mixing into a resin composition consisting of at least a resin selected from polyvinyl alcohol, polyvinyl acetal and polyvinyl acetate and into a water-soluble composition including at least a cross linking agent selected from a group of the cross linking agents consisting of melamine (hexamethylol melamine) derivative, urea (N, N'-methoxymethy methoxyethylene urea) derivative, uryl (tetramethoxymethy grycol uryl) derivative will be discussed below.

Here, a non-ionic interfacial active agent (Clean-through, KS-2010 produced by Kao Co., Ltd.) is adapted to a resin selected from polyvinyl alcohol, polyvinyl acetal and polyvinyl acetate. As the condition to select the interfacial active agent, it is preferable that the agent is not an inorganic alkali salt, because if an interfacial active agent including alkali metal such as Na (sodium) or the like is used, it will probably deteriorate in some cases the surface of element region of a semiconductor device. Therefore, it is recommended to avoid use of the interfacial active agent based on inorganic alkali salt in order to improve the manufacturing yield. According to the finding of the inventors of the present invention, in more practical, amount of alkali metal contained shall be set 0.1 ppm or less.

Table 4 shows changes of thickness of the pattern when amount of addition (wt %) of the interfacial active agent to the entire part of the pattern swelling film is changed.

TABLE 4

| addition amount (wt %) | altering amount (Å) | increasing ratio (%) | |
|---|---|---|---|
| 1 | 59 | 1.7 | |
| 3 | 140 | 3.8 | |
| 4 | 240 | 6.7 | |
| 5 | 500 | 13.9 | * |
| 7 | 700 | 19.9 | * |
| 10 | 420 | 11.4 | * |

* Surface becomes to be rough. (Surface becomes to be white-coloured.)

According to Table 4, when amount of addition (wt %) is changed to 1, 3, 4, 5, 7 and 10, the amount of change (Å) also changes to 59, 140, 240, 500, 700 and 420 and increase rate of thickness (%) before and after the pattern swelling process changes to 1.7, 3.8, 6.7, 13.9, 19.9 and 11.4.

FIG. 2 is a graph showing the relationship between amount of addition of the interfacial active agent and change of film thickness and this graph suggests that increase rate (%) of film thickness (vertical axis) increases or decreases depending on increase or decrease of the amount of addition (wt %) of the interfacial active agent. According to this graph, under the conditions explained above, it can be understood that the increase rate of film thickness becomes optimal when amount of addition of the interfacial active agent is 7 wt % and it can be said in general that increase in amount of addition of the interfacial active agent is only the best selection. Actually, when excessively large amount of interfacial active agent is added, aggregation becomes a problem and thereby the interfacial active agent is allocated with deviation and therefore it can be thought that sufficient pattern swelling amount cannot be obtained. Moreover, when amount of addition of the interfacial active agent exceeds 5 wt % among the result of experiments, the surface of pattern is roughed (nebula is generated) and this event will generate a fear for generation of a problem that control for the shape of pattern becomes difficult. In order to control the roughness of surface (generation of nebula) while amount of addition of the interfacial active agent is increased, it is effective, for example, to add an organic solvent.

(Discussion on Interfacial Active Agent: Part 2)

Next, the inventors of the present invention have conducted for the example where the other interfacial active agent is added to the water-soluble composition including an uryl derivative as a cross linking agent into a resin material consisting of a mixture of polyvinyl alcohol and polyvinyl acetal. As the interfacial active agent, the clean-through (RI-100, manufactured by Kao Co., Ltd.) (amphipatic interfacial active agent) has been used.

Table 5 shows the result of experiments for checking the changes in amount of increase of film thickness (Å) and increase rate of film thickness (%) for the amount of addition (wt %) of the interfacial active agent. When the amount of addition (wt %) is changed to 2, 3, 4, 5 and 7 wt %, amount of increase of the resist pattern film thickness (Å) is changed to 29, 110, 570, 920 and 1150 while increase rate of the resist pattern film thickness (%) is changed to 0.8, 3.0, 15.8, 25.3 and 31.0 before and after the reaction of the pattern swelling material.

TABLE 5

| addition amount (wt %) | increasing amount (Å) | increasing ratio (%) | |
|---|---|---|---|
| 2 | 29 | 0.8 | |
| 3 | 110 | 3.0 | |
| 4 | 570 | 15.8 | * |
| 5 | 920 | 25.3 | * |
| 7 | 1150 | 31.0 | * |
| 10 | — | — | |

* Surface becomes to be rough. (Surface becomes to be white-coloured.)

The same result is also shown in the graph of FIG. 3, but the above table also shows changes of increase rate of resist pattern film thickness (%) (vertical axis) before and after the reaction of the pattern swelling material for the amount of addition of the interfacial active agent (wt %) (horizontal axis) into the pattern swelling material. According to the above table, when the interfacial active agent explained above is used, increase in amount of addition of the interfacial active agent (wt %) brings about increase of the increase rate of the resist pattern film thickness (%) and any optimal point cannot be found in the range of the amount of addition of the interfacial active agent in the experiments. In the example of the interfacial active agent, when amount of addition of the interfacial active agent is 4 wt % or more, the surface of resist pattern is roughed (nebula is generated), and such event can be prevented by utilizing addition of an organic solvent as a means.

Each item explained above relates to an example where a pattern swelling material is constructed by resin material+ cross linking agent+interfacial active agent and the pattern swelling effect can be attained by improving affinity of the pattern swelling material at the surface of resist pattern with the interfacial active agent within the elements. Subsequently, an example of the resin material+cross linking agent+organic negative resist will then be explained.

(Discussion on Addition of Organic Negative Resist)

This example is based on the concept that affinity with pattern swelling material is improved to enhance the pattern swelling effect through a little dissolving of the resist pattern surface.

In this specification, the official names of the compound melamine, urea and uryl used as the cross linking agents are sequentially hexamethylol melamine, N,N'-methoxymethyl-methoxyethylene urea and tetra-methoxymethyl glycol uryl.

High swelling effect in the organic negative resist has been found first in the following two kinds of negative resists A and B obtained by mixing the following materials (i) to (iii).

(i) Resin solvent: Maruzen PVP (polyvinyl phenol resin)+ ethylene glycol+propylene glycol methylether are mixed in the ratio of 1:6.5:3.5.

(ii) Cross linking agent C: Hexamethylol melamine+water+isopropyl alcohol are mixed in the ratio of 1:8.6:0.4.

(iii) Cross linking agent D: (N,N'-methoxymethyl-methoxyethylene urea)+water+isopropyl alcohol are mixed in the ratio of 1:8.6:0.4.

Negative resist A: Resin solvent (i) of 9 pts.wt. (parts by weight) and cross linking agent C (ii) of 1 pts.wt. are mixed.

Negative resist B: Resin solvent (i) of 9 pts.wt. and cross linking agent D (iii) of 1 pts.wt. are mixed. Pattern swelling material A: A composition obtained by adding the uryl derivative as the cross linking agent to a resin composition mixing polyvinyl alcohol and polyvinyl acetal is mixed with the negative resist A in the ratio of 9:1.

Pattern swelling material B: A composition obtained by adding the uryl derivative as the cross linking agent to a resin composition mixing polyvinyl alcohol and polyvinyl acetal is mixed with the negative resist B in the ratio of 9:1.

In the case of the development (60 seconds) using the water, a negative resist as thin as 1350 Å or less is left. In the case of development of 2.38% TMAH (Tetramethyl ammonium hydroxide), a part which seems to be a cloudy layer dissolves as shallow as about 300 Å or less. However, in the development (30 seconds) of 0.238% TMAH (Tetramethyl ammonium hydroxide), increase of film thickness by 2% or more can be recognized. With this result, it is true that a certain swelling effect can be observed and therefore further discussion on the cross linking agent has been continued.

(Effect of Addition of PVP (Polyvinyl Phenol Resin Based) Negative Resist)

The inventors have also discussed addition of a plurality of cross linking agents to the pattern swelling materials A and B explained above. As the cross linking agents, the melamine derivative, urea derivative and uryl derivative have been used respectively. As the experiment conditions, the baking is conducted for 120 seconds at 115° C. and the development is conducted through reaction with the aqueous solution of 0.238% TMAH (Tetramethyl Ammonium Hydroxide). In this case, the cross-sectional diameter of a hole pattern provided on the resist has been 239.3 nm when the swelling process is not conducted, but when the cross linking agent is changed to above three kinds of agent (melamine derivative, urea derivative and uryl derivative, following results have been obtained. Namely, amount of reduction of hole pattern is −29.1 nm for the melamine derivative, −29.7 nm for the urea derivative and −32.4 nm for the uryl derivative. From these results, it can be assumed that swelling of resist pattern is surely promoted and hole pattern is also reduced even when any type of cross linking agent listed above is employed. It can also be understood that there is no large difference in the swelling effects, reduction of hole pattern of about 20 to 30 nm in the cross-sectional diameter can be realized but when the uryl derivative is used, amount of reduction of the hole pattern can be further improved a little. In regard to such this result, the inventors of the present invention presumes as follows. The melamine, urea and uryl respectively have six, two and four coupling hands to contribute to the cross linking within one molecule thereof and therefore the melamine is most useful for the cross linking from point of view of the number of coupling hands for contribution to the cross linking. However, when the melamine having six coupling hands within one molecule is used as the cross linking agent, since the cross linking extremely progresses within the pattern swelling film itself and the cross linking property is extinguished within the pattern swelling film, the swelling effect of the resist pattern used as the lower layer of the pattern swelling film will be reduced. On the other hand, when the urea derivative is used, since this material has only two coupling hands for contribution to the cross linking within one molecule thereof, the cross linking property of the urea derivative is weak and therefore it can be assumed that the resist pattern is not sufficiently swelled and the hole pattern reduction effect is rather low. After all, the melamine assuring very high cross linking property and the urea assuring very low cross linking property show rather low resist pattern swelling effect and the uryl assuring an intermediate cross linking property shows the highest resist pattern swelling effect.

Here, there is provided the result of the experiments to know the swelling effect of the resin F formed by mixing the polyvinyl alcohol, polyvinyl acetal and polyvinyl acetate in the weight ratio of 75:10:15 when amount of addition of the polyvinyl phenol based negative resist is changed. As the experimental conditions, urea is used as the cross linking agent, a coater is rotated at 850 rpm for five seconds, 3500 rpm for 40 seconds in order to form the coated pattern swelling film, the film is baked for 120 seconds at 115° C. and the 0.238% TMAH (tetramethyl ammonium hydroxide) is used as the developer.

Following results of hole pattern diameter have been obtained when the contents of polyvinyl phenol based negative resist are changed to 10 wt %, 20 wt % and 30 wt % of the total weight and when the pattern swelling process is not executed. For each experiment, the results of 318.9 nm, 295.3 nm and 260.1 nm have been obtained. When the pattern swelling process is not executed, the hole pattern diameter is 344.2 nm. From these results, it has been proved that the swelling amount of pattern is expanded with increase of content of the polyvinyl phenol based negative resist resin. When the content of the polyvinyl phenol based negative resist is set as much as 30 wt %, it can be understood that the pattern is surely deformed but the reason thereof can be presumed that when amount of the polyvinyl phenol based negative resist increases, amount of isopropyl alcohol included therein also increases.

Next, the swelling profile of pattern has been observed by changing the baking temperature in order to know the effect of baking temperature when the polyvinyl phenol based negative resist is added to the resin F formed by mixing polyvinyl alcohol, polyvinyl acetal and polyvinyl acetate in the weight ratio of 75:10:15. In the example where the pattern swelling process is not executed, the hole pattern diameter of 344.2 nm is changed to 335.9 nm for the baking temperature of 85° C., 318.9 nm for the temperature of 115° C., 286.6 nm for the temperature of 125° C. and 285.9 nm for the temperature of 135° C. As the experimental conditions, content of the polyvinyl phenol based negative resist is set to 10 wt % and urea is included as the cross linking agent. The baking is conducted for 120 seconds and the spin coating is conducted for 5 seconds at 850 rpm and 40 seconds at 3500 rpm in order to form the coated pattern swelling material film. As the developer, the 0.238% TMAH (tetramethyl ammonium hydroxide) is used. Under the conditions explained above, it can be understood that the hole pattern is reduced when the baking temperature is raised through the comparison of results when the baking temperature is set to 85° C., 115° C., 125° C. and 135° C. and when the pattern swelling process is not conducted.

(Effect of Increase of Urea Cross Linking Agent Added to Polyvinyl Phenol Based Negative Resist)

The inventors of the present invention have also conducted experiments to know the pattern swelling Effect when addition of the cross linking agent (urea) to the polyvinyl phenol based negative resin composition is increased. Experimental conditions are that the polyvinyl phenol based negative resin composition and urea are mixed in the weight ratio of 8:2, a solution mixing the ethylene glycol and propylene glycol methylether in the ratio of 65:35 is used as the solvent, the baking temperature is set to 85° C. for 70 seconds and thereafter to 115° C. for 70 seconds, the 1.5% TMAH is used as the developer and the developing period is set to 30 seconds. In an example where the pattern swelling process is not conducted, the hole pattern diameter is 333.5 nm, but this diameter is increased to 347.6 nm, on the contrary, when amount of the urea as the cross linking agent is increased. From this result, the inventors have obtained the conclusion that the pattern swelling effect is never increased even when the amount of urea as the cross linking agent is increased.

(Effect of Addition of Polyvinyl Acetal to Polyvinyl Phenol Based Negative Resist)

Next, the inventors have also searched the influence on the reaction property when the polyvinyl acetal is added to the polyvinyl phenol based negative resin composition. As the experimental conditions, the polyvinyl phenol based negative resist resin, urea and polyvinyl acetal (KW-3; Sekisui Chemical) are mixed in the ratio of 8:1:1, a solution mixing the ethylene glycol and propylene glycol methylether in the ratio of 65:35 is used as the solvent, the baking temperature is set to 85° C. for 70 seconds and thereafter to the following temperatures for 70 seconds, the 1.5% TMAH is used as the developer and the developing period is set to 30 seconds. In this case, when the baking temperature is set respectively to 115° C., 120° C. and 125° C., distinctive change cannot be observed at the temperature listed above in the degree of pattern swelling. When the swelling process is not conducted, the hole pattern diameter on the resist is 333.5 nm. On the other hand, the hole pattern diameter when the temperature of the baking process (latter half processes) is set to 115° C. is 327.3 nm at the stage where the baking process (former half processes is completed and 339.1 nm when the processes are completed up to the latter half processes. The hole pattern diameter when the temperature of the baking process (latter half processes) is set to 120° C. is 326.6 nm when the baking process (former half processes) is completed and 335.2 nm when the latter half processes are completed. The hole pattern diameter when the temperature of the baking process (latter half processes) is set to 125° C. is 328.1 nm when the baking process (former half processes) is completed and 333.6 nm when the processes are completed up to the latter half processes. From these results, it can be understood that addition of polyvinyl acetal itself does not control the pattern swelling effect even when the polyvinyl acetal is added when the phenol based resin is included in the pattern swelling material.

(Trial Manufacture of Swelling Material of the Other Compositions)

According to the findings of the inventors of the present invention, it is already proved that when a resin composition as the base material is a mixture comprising both polyvinyl alcohol and polyvinyl acetal, this mixture shows extremely higher swelling effect. However, it is true that even when a material does not include these two kinds of resin compositions, the swelling effect can be obtained. Examples which mainly include the polyvinyl acetal will be explained, in order to enhance the swelling effect, based on the experiments conducted by the inventors of the present invention.

(1) When the pattern swelling film is formed of a material film mixing the polyvinyl acetal (KW-3, Sekisui Chemical) and cross lining agent (composition: urea or uryl in the weight ratio of 16:x, following change of effect can be confirmed. As the experimental conditions, the solvent is formed by mixing the pure water (deionized water) and isopropyl alcohol in the ratio of 82.6:0.4 and the interfacial active agent is not used. On the occasion of forming the pattern swelling material by the coating process, the spin coating is conducted for 5 seconds at 850 rpm and thereafter for 40 seconds at 3500 rpm. In the baking process, the baking is conducted for 70 seconds at 85° C. and thereafter for 70 seconds at 115° C.

First, when the patterning is executed without using a pattern swelling film as the contrast experiment, the hole pattern diameter of the resist is 333.5 nm.

When the urea is included as the cross linking agent in the content ratio of 1 for the polyvinyl acetal of 16, the hole pattern diameter when the former baking process is completed is 334.4 nm and the hole pattern diameter when the latter baking process is completed is 322.7 nm.

When the urea is included as the cross linking agent in the content ratio of 0.67 for the polyvinyl acetal of 16, the hole pattern diameter when the former baking process is completed is 333.6 nm and the hole pattern diameter when the latter baking process is completed is 316.4 nm.

When the urea is included as the cross linking agent in the content ratio of 0.45 for the polyvinyl acetal of 16, the hole pattern diameter when the former baking process is completed is 334.4 nm and the hole pattern diameter when the latter baking process is completed is 325.0 nm.

When the uryl is included as the cross linking agent in the content ratio of 1 for the polyvinyl acetal of 16, the hole pattern diameter when the former baking process is completed is 332.8 nm and the hole pattern diameter when the latter baking process is completed is 319.5 nm.

When the uryl is included as the cross linking agent in the content ratio of 0.67 for the polyvinyl acetal of 16, the hole pattern diameter when the former baking process is completed is 339.0 nm and the hole pattern diameter when the latter baking process is completed is 310.2 nm.

When the uryl is included as the cross linking agent in the content ratio of 0.45 for the polyvinyl acetal of 16, the hole pattern diameter when the former baking process is completed is 336.0 nm and the hole pattern diameter when the latter baking process is completed is 319.5 nm.

Comparison of reduced hole diameters in above experimental results teaches that the reaction property is higher than that of the resin F mixing the polyvinyl alcohol, polyvinyl acetal and polyvinyl acetate in the weight ratio of 75:10:15 even when the interfacial active agent is not included. In the example where the uryl is selected as the cross linking agent and the content ratio of the polyvinyl acetal and cross linking agent is set to 16:0.67, the hole diameter is reduced in the maximum degree and it means the highest pattern swelling effect is obtained.

(2) When the pattern swelling film is formed of a material film by mixing the polyvinyl acetal (KW-3, Sekisui Chemical), cross linking agent (composition: urea or uryl), pure water (deionized water) and isopropyl alcohol in the weight ratio of 16:1:82.6:0.4 and the interfacial active agent is included in the 2 pts.wt., following changes of effect can be confirmed by changing the interfacial active agent and cross linking agent. As the experimental conditions, the spin coating is conducted for 5 seconds at 850 rpm and thereafter for 40 seconds at 3500 rpm to form a film and the baking process is conducted for 70 seconds at 85° C. and subsequently for 70 seconds at 115° C.

Moreover, following results have also be obtained by employing urea and uryl as the two kinds of cross lining agent and non-ionic interfacial active agents L-64 and B-733 as the two kinds of interfacial active agent (manufactured by Asahi Denka). When the urea is used as the cross linking agent and L-64 (Asahi Denka) as the non-ionic interfacial active agent, hole pattern diameter of the resist of 342.1 nm before the pattern swelling process is reduced to 320.3 nm after the pattern swelling process. When the uryl is used as the cross linking agent and L-64 (Asahi Denka) is used as the non-ionic interfacial active agent, the hole pattern diameter of the resist of 337.5 nm before the pattern swelling process is reduced to 313.3 nm after the pattern swelling process. When the urea is used as the cross linking agent and B-733 (Asahi Denka) is used as the non-ionic interfacial active agent, the hole pattern diameter of resist of 340.4 nm before the pattern swelling process is reduced to 318.8 nm after the pattern swelling process. When the uryl is used as the cross linking agent and B-733 (Asahi Denka) is used as the non-ionic interfacial active agent, the hole pattern diameter of resist of 336.7 nm before the pattern swelling process is reduced to 310.9 nm after the pattern swelling process. According to these results, it can be understood that amount of reduction of the hole pattern is increased as much as about 10 nm with addition of the interfacial active agent. Moreover, when L-64 is used as the non-ionic interfacial active agent, the surface seems to be more easily roughed than the case where B-733 is used.

(3) When the pattern swelling film is formed by a material film obtained by mixing the polyvinyl acetal (KW-3, Sekisui Chemical), cross linking agent, pure water (deionized water) and isopropyl alcohol in the weight ratio of 16:1:82.6:0.4 and moreover the non-ionic interfacial active agent TN-80 (Asahi Denka) is also mixed, change of the swelling effect has been confirmed. As the experimental conditions, the coater is rotated at 540 rpm for 5 seconds and thereafter rotated at 3500 rpm for 40 seconds during the spin coating to form a film of the pattern swelling material and the baking is conducted for 70 seconds at 85° C. and thereafter for 70 seconds at 115° C. Moreover, the urea or uryl is employed as the cross linking agent and the interfacial active agent (TN-80) is changed to 0.5 pts.wt. and 0.25 pts.wt. The profile of the pattern swelling effect is as follows. In the example where the non-ionic interfacial active agent TN-80 (Asahi Denka) is set to 0.5 pts.wt. and the urea is used as the cross linking agent, the hole pattern diameter of resist of 343.0 nm after completion of the former baking is reduced to 275.8 nm after completion of the latter baking. When TN-80 is set to 0.5 pts.wt. and the uryl is used as the cross linking agent, the hole pattern diameter of resin of 342.6 nm after completion of the former baking is reduced to 263.4 nm after completion of the latter baking. When TN-80 is set to 0.25 pts.wt. and the urea is used as the cross linking agent, the hole pattern diameter of resist of 335.0 nm after completion of the former baking is reduced to 335.9 nm after completion of the latter baking. When TN-80 is set to 0.25 pts.wt. and the uryl is used as the cross linking agent, the hole pattern diameter of resist of 337.5 nm after completion of the former baking is reduced to 296.1 nm after completion of the latter baking. According to these results, it has been proved that when TN-80 is used as the interfacial active agent, the effect of the resist pattern swelling (namely, reduction of hole pattern) is particularly distinctive for the pattern swelling film of the compositions explained above when the uryl is used as the cross linking agent.

(4) When the pattern swelling film is formed of a material film formed by mixing the polyvinyl acetal (KW-3, Sekisui Chemical), cross linking agent (composition: urea or uryl), pure water (deionized water) and isopropyl alcohol in the weight ratio of 16:1:82.6:0.4 and moreover the non-ionic interfacial active agent TN-80 (Asahi Denka) of 0.25 pts.wt. and GBL (γ-butyloractone) of 2 pts.wt. are further mixed to such material film, following changes of swelling effect have been confirmed. As the experimental conditions, the coater is rotated at 850 rpm for 5 seconds and thereafter rotated at 3500 rpm for 40 seconds during the spin coating to form the pattern swelling film and the baking is conducted for 70 seconds at 85° C. and thereafter for 70 seconds at 115° C.

The urea or uryl is used as the cross linking agent in above experiments and the resist pattern swelling profile of each case is as follows. When the urea is used as the cross linking agent, the hole pattern diameter in the resist of 335.9 nm after completion of the former baking process is increased up to 375.6 nm after completion of the latter baking process. When the uryl is selected as the cross linking agent, the hole pattern diameter in the resist of 338.9 nm after completion of the former baking process is reduced up to 252.3 nm after completion of the latter baking process. Namely, change of shape at the area near the hole pattern opening can be detected with addition of GBL but distinctive hole pattern reduction (resist pattern swelling) effect cannot be detected.

(5) When the pattern swelling film is formed of a material film formed by mixing the polyvinyl acetal (KW-3, Sekisui Chemical), cross linking agent (urea), pure water (deionized water) and isopropyl alcohol in the weight ratio of 16:1:82.6:0.4 and the polyvinyl phenol based negative resist of 10 wt % is further mixed this material film, the pattern swelling profiles have been observed by changing the interfacial active agent. As the experimental conditions, the spin coating is conducted for 5 seconds at 850 rpm and thereafter for 40 seconds at 3500 rpm, the baking is conducted for 120 seconds at 115° C. and the 0.238% TMAH (tetramethyl ammonium hydroxide) is used as the developer.

When the non-ionic interfacial active agent L-64 (Asahi Denka) of 2 pts.wt. or RI-100 (Asahi Denka) of 3 pts.wt. is used as the interfacial active agent and when the interfacial active agent is not used, the pattern swelling material is formed of a material film formed by mixing the polyvinyl acetal (KW-3, Sekisui Chemical), cross linking agent (urea), pure water (deionized water) and isopropyl alcohol in the weight ratio of 16:1:82.6:0.4 and the polyvinyl phenol based negative resist of 10 wt % is still mixed thereto, results of the pattern swelling are as follows. Moreover, the results of the contrast experiment where the same interfacial active agent is used, the resin F formed by mixing the polyvinyl alcohol, polyvinyl acetal and polyvinyl acetate in the weight ratio of 75:10:15 is used as the pattern swelling material and the urea is added thereto as the cross linking agent are also shown. First, in the example where the pattern swelling material is formed of a material film formed by mixing the polyvinyl acetal (KW-3, Sekisui Chemical), cross linking agent (urea), pure water (deionized water) and isopropyl alcohol in the weight ratio of 16:1:82.6:0.4 and moreover the polyvinyl phenol based negative resist of 10 wt % is mixed to such swelling material film, the hole pattern diameter in the resist is 325.8 nm when L-64 is 2 pts.wt. and 281.2 nm when RI-100 is 3 pts.wt. In the case where the interfacial active agent is not mixed, such hole pattern diameter is 342.9 nm. Meanwhile, when the pattern swelling material is formed of a resin F formed by mixing the polyvinyl alcohol, polyvinyl acetal and polyvinyl acetate in the weight ratio of 75:10:15 and the urea is mixed thereto as the cross linking agent, the hole pattern diameter is 297.6 nm when L-64 is 2 pts.wt. and 187.5 nm when the RI-100 is 3 pts.wt. Moreover, when the pattern swelling process is not conducted as the contrast experiment, the hole pattern diameter is 344.2 nm. According to these results, in the contrast experiment where the polyvinyl alcohol is mixed, the hole pattern is reduced in general, suggesting that the resist pattern swelling is rather progressed. From this result, it is possible to presume that the polyvinyl alcohol is an important element to control the resist pattern swelling effect. Here, it can also be presumed that when only the polyvinyl acetal is included, the resist pattern swelling effect is small and when the polyvinyl acetal and polyvinyl alcohol are used in combination, a certain multiplier effect can be obtained. In regard to the mixing rate of the polyvinyl alcohol, polyvinyl acetal and polyvinyl acetate, it has also been proved that when the polyvinyl acetal is set to 5 to 40 wt % of the entire part, the pattern swelling effect can be enhanced and more preferably when such polyvinyl acetal is set to 10 to 30 wt %, the pattern swelling effect can be increased in the maximum degree.

BRIEF DESCRIPTION OF THE DRAWINGS

FIG. 10 is cross-sectional views for explaining a method of manufacturing an EPROM as the third embodiment of the present invention.

DESCRIPTION OF PREFERRED EMBODIMENTS

Figure 1:
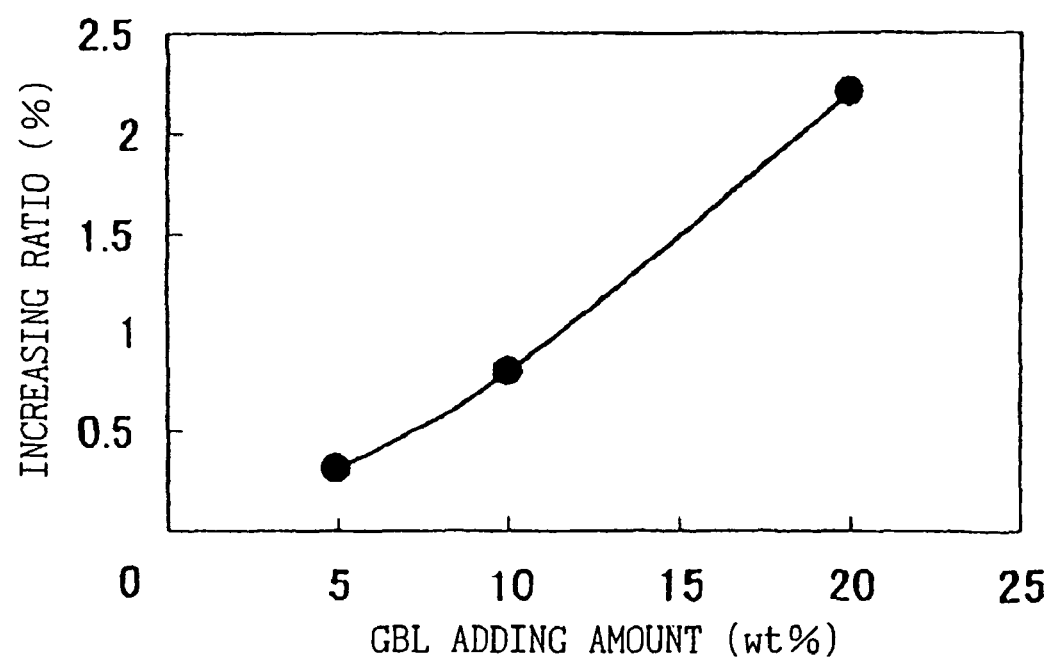
FIG. 1 is a graph showing changing rates (%) of the thickness of the resist pattern when amount of addition of the GBL is changed.
Figure 2:
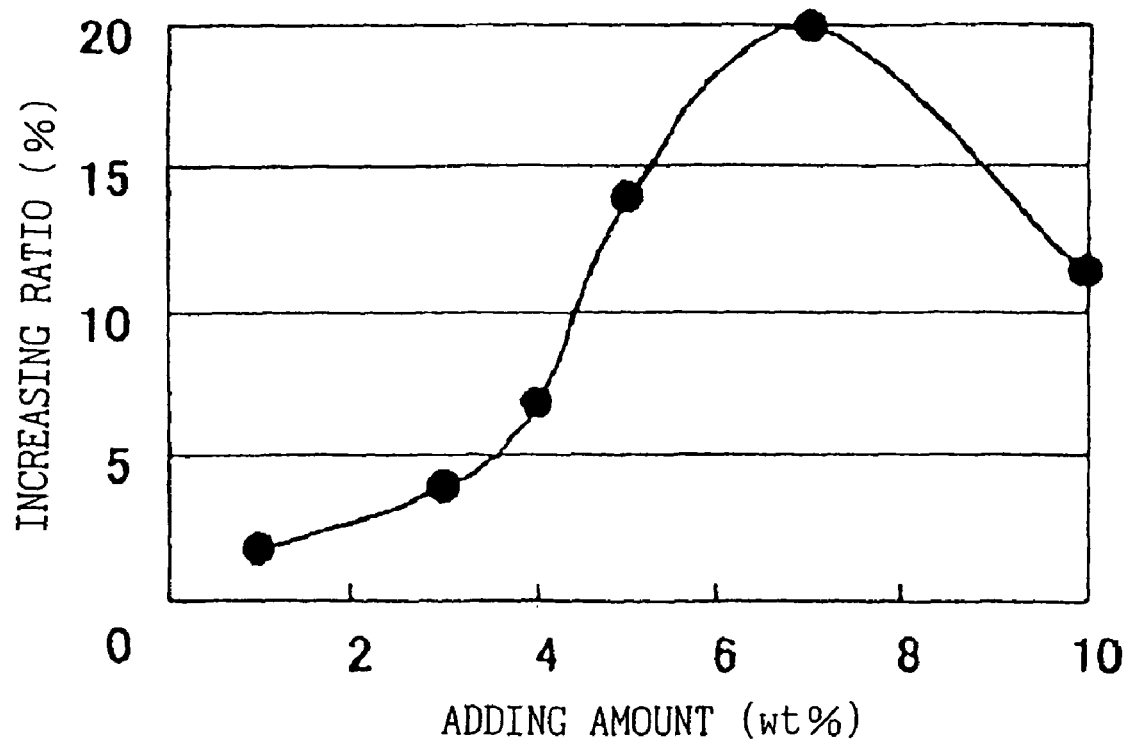
FIG. 2 is a graph showing the relationship between amount of addition of the interfacial active agent and change of film thickness.
Figure 3:
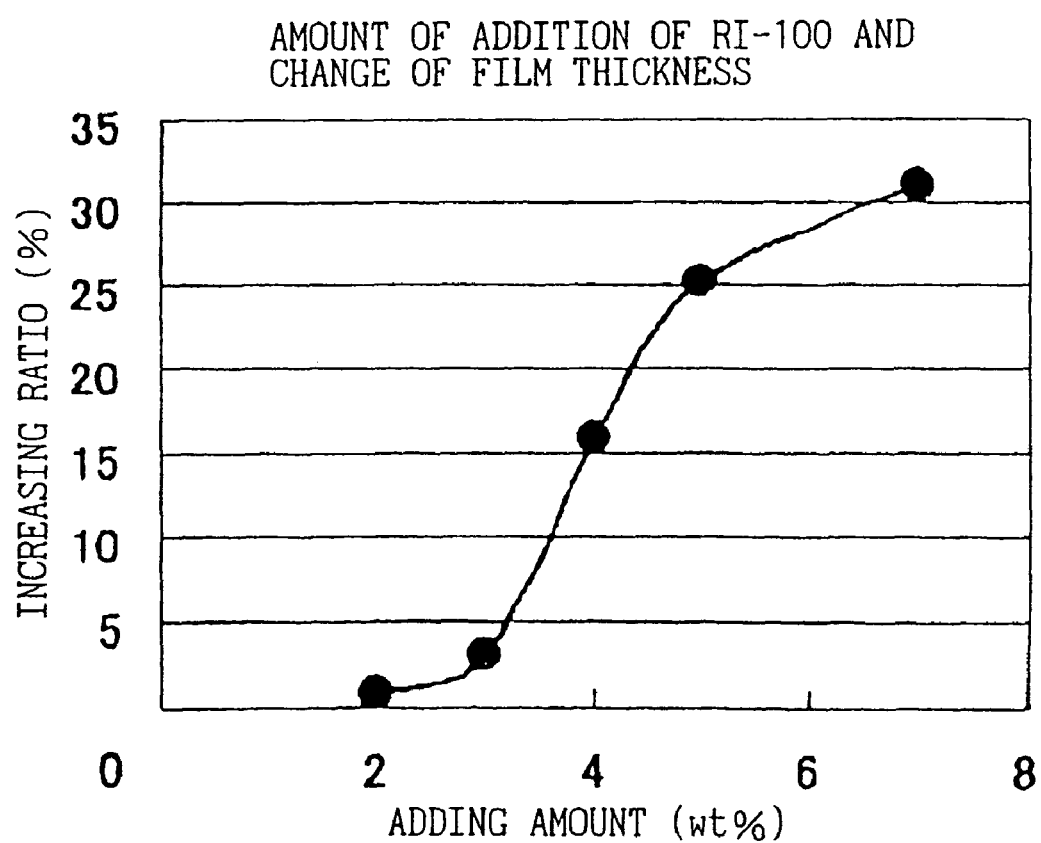
FIG. 3 is a graph showing the relationship between amount of addition of RI-100 and change of film thickness.

The embodiments of the present invention will be described below with reference to the accompanying drawings. Note that the following reference numerals are used in the drawings.

| | |
|---|---|
| 1: | Photoresist film; |
| 1a: | Resist pattern; |
| 2: | Resist pattern swelling film; |
| 2a: | Swelled resist pattern; |
| 3: | Interlayer insulation film; |
| 4: | Swelled resist pattern; |
| 22: | Si substrate (semiconductor substrate); |
| 23: | Field oxide film; |
| 24a: | First gate insulation film; |
| 24b: | Second gate insulation film; |
| 25a: | First threshold value control layer; |
| 25b: | Second threshold value control layer; |
| 26, 27, 29, 32, 34, 43: | Resist film; |
| 28, 28a: | First polysilicon film (first conductive material layer); |
| 28b: | Gate electrode (first polysilicon film); |
| 28c: | Floating gate electrode; |
| 30a, 30c: | Capacitor insulation film; |
| 30b, 30d: | $SiO_2$ film; |
| 31, 31b: | Second polysilicon film (second conductive material film); |
| 31a: | Control gate electrode; |
| 33a, 44a: | First gate; |

| | |
|---|---|
| 33b, 33c, 44b: | Second gate; |
| 35a, 35b, 36a, 36b, 45a, 45b, 46a, 46b: | Source/drain region layer; |
| 37, 47: | Interlayer insulation film; |
| 38a, 38b, 39a, 39b, 48a, 48b, 49b, 49b: | Contact hole; |
| 40a, 40b, 41a, 41b, 50a, 50b, 51a, 51b: | Source/drain electrode; |
| 42: | Refractory metal film (fourth conductive material film); |
| 42a: | Control gate electrode (refractory metal film; fourth conductive material film); |
| 42b: | Gate electrode (refractory metal film; fourth conductive material film); |
| 52a, 52b: | Opening; |
| 53a, 53b: | Refractory metal film (third conductive material film); and |
| 54: | Insulation film; |

(First Embodiment)

Figure 4:
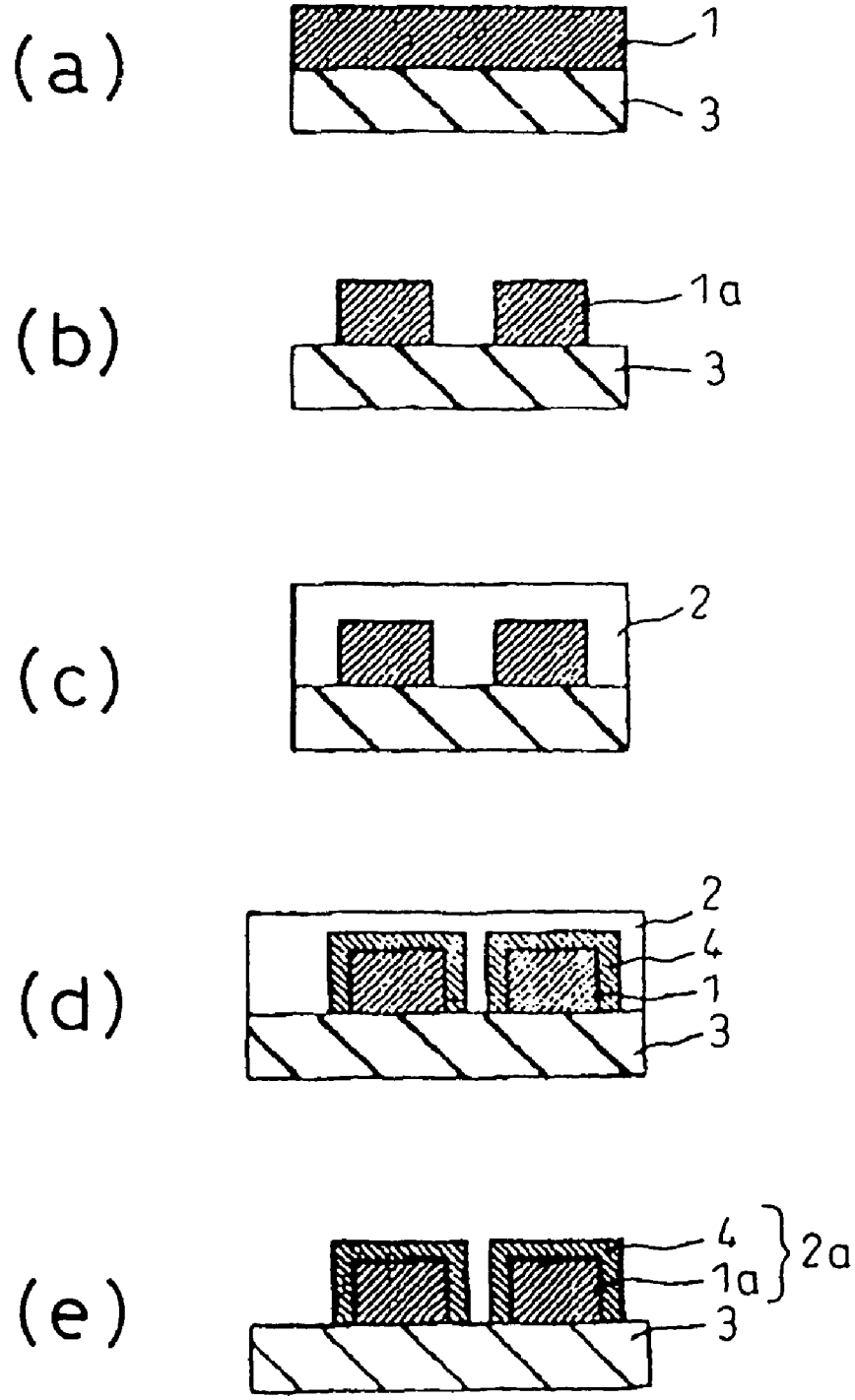
FIG. 4 is schematic cross-sectional views showing the profiles of a resist pattern before and after the swelling process (an example where the polyvinyl phenol based negative resist composition is added to the resin as the base material such as polyvinyl alcohol)
Figure 5:
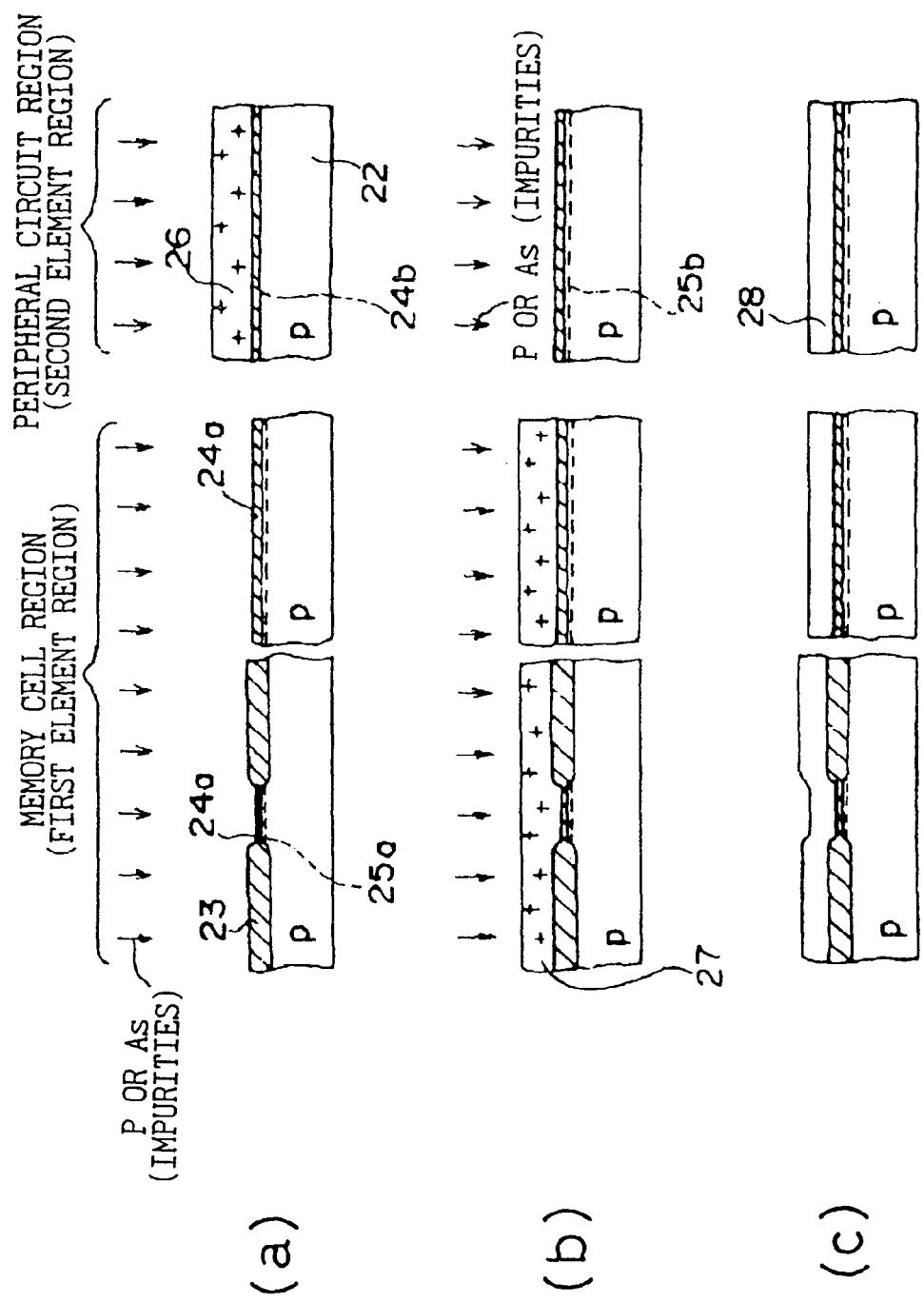
FIG. 5 is cross-sectional views (Part 1) for explaining a method of manufacturing an EPROM as the first embodiment of the present invention.
Figure 6:
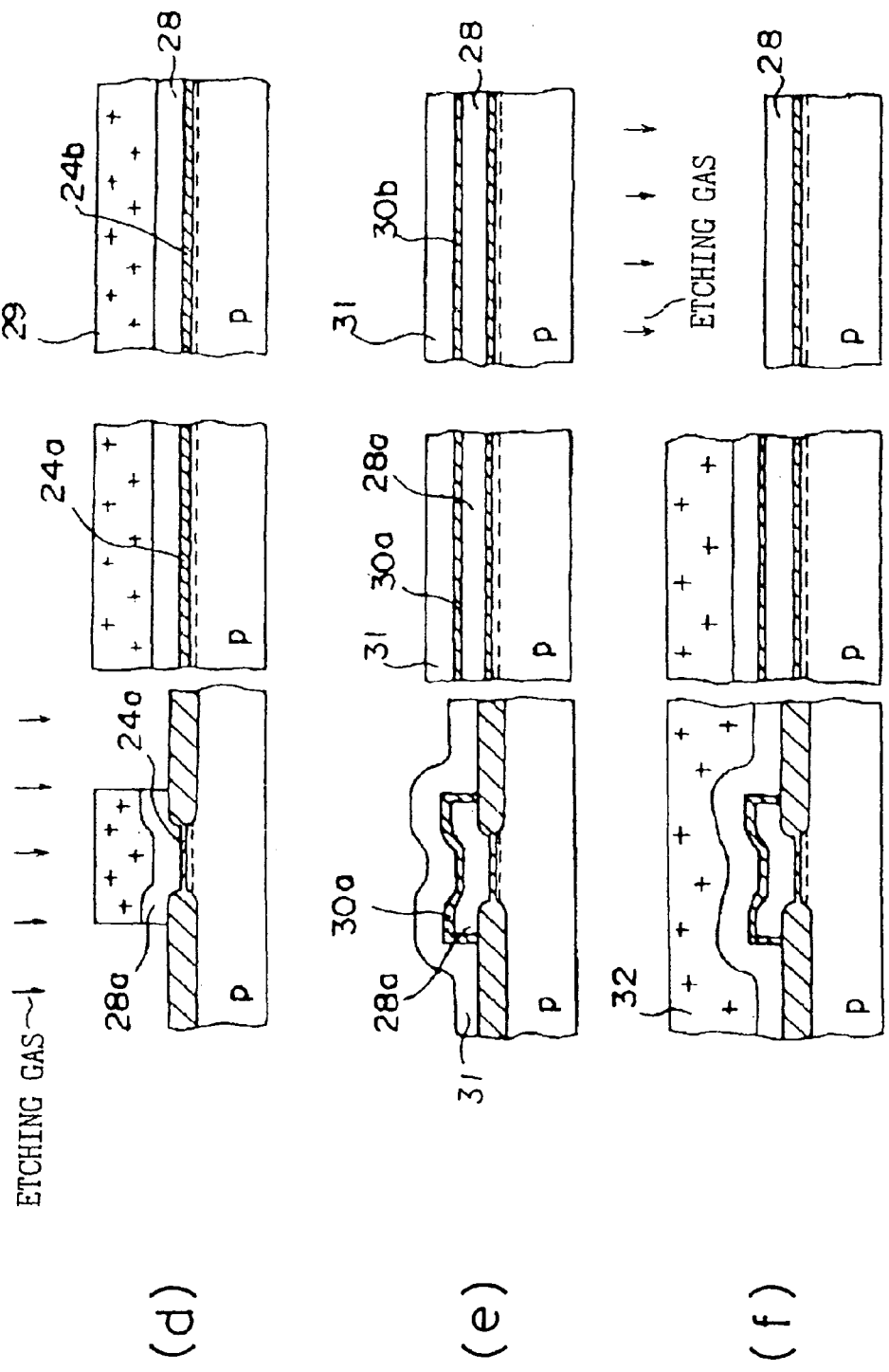
FIG. 6 is cross-sectional views (Part 2) for explaining a method of manufacturing an EPROM as the first embodiment of the present invention.

Refer to FIG. 4(a):

FIGS. 4(a) to 4(e) are cross-sectional views showing profiles of the resist pattern before and after the swelling process. The cross-sectional views of the essential portion including the resist pattern are sequentially shown in FIGS. 4(a) to 4(e).

After an element region is provided on a semiconductor substrate (not illustrated) with the well known method, a silicon oxide film, for example, is formed to the entire surface as an interlayer insulation film with the CVD (Chemical Vapor Deposition) method. Thereafter, a positive resist is formed on the flat surface by the uniform coating process with the well known spin coating method. For selection of an example of the positive resist material, it is preferable as explained above to select the alicyclic group based resist from the viewpoint of the resolution and resistance for dry-etching.

Refer to FIG. 4(b):

Next, the resist film 1 is patterned with the well known photolithography method to form a resist pattern 1a. In more detail, after formation of the positive resist film to the entire surface, this film is irradiated with the ArF (argon fluoride) excimer laser beam for the purpose of exposure. Thereafter, the film is then baked and developed to form a hole pattern. In this case, amount of exposure is set, for example, to 50 mJ/cm$^2$ to realize the film thickness of 5060 Å after the development. Here, the interfacial active agent may be added in the development process in order to improve the development property.

Refer to FIG. 4(c):

Next, a swelling material 2 is formed by coating on the interlayer insulation film 3, covering the entire surface of the resist pattern 1a. Here, a material in which the interfacial active agent of several % is added to the resin base material obtained by mixing the polyvinyl acetal and polyvinyl alcohol is used as the swelling material 2. In more detail, the swelling material is constructed by mixing the resin composition including the polyvinyl acetal and polyvinyl alcohol in the weight ratio of 7:3, a water soluble composition including at least a cross linking agent selected from a group of the cross linking agents consisting of the melamine derivative, urea derivative and uryl derivative and at least a kind of the interfacial active agent such as polyoxyethylene-polyoxypropylene condensation product. In this case, it is enough for film formation to use the well known spin coating method and film thickness should be at least 1000 Å and preferably about 2000 Å to 5000 Å.

Refer to FIG. 4(d):

In this case, while the pattern swelling film is formed by coating and thereafter it is developed with the pure water, the film thickness is increased by 4% (the part indicated with the numeral "4" in the figure), and therefore it can be assumed that the swelling of pattern is surely generated. Under the condition that the baking processes before and after the exposure are respectively conducted at 130° C. and 140° C. and the amount of exposure is set to 50 mJ/cm$^2$, when the pattern is left for two minutes after the operation of the resist pattern swelling film, increase of the thickness of 3.5% has been recognized in comparison with the thickness detected immediately after the development. In the case where the baking is conducted after the exposure under the same condition, when the resist is left for two minutes after the development with the pure water through operation of the resist pattern swelling film, increase of the thickness of 3.4% has been recognized. The water-washing process after the process with the developer using a water-soluble alkali developer can be saved and thereby processes can be as much simplified by removing the non-swelling portion of the resist pattern (also including the remaining resist pattern swelling portion) through employment of the pure water.

Refer to FIG. 4(e):

The resist pattern formed through the processes explained above is shown in FIG. 4(e).

(Second Embodiment)

In the second embodiment, the second invention of the present invention, namely an embodiment of the swelling material to be formed by coating to cover the surface of resist pattern is constructed with a phenol resin and a solvent which includes at least a kind of cross linking agent selected from a group of the cross linking agents consisting of melamine derivative, urea derivative and uryl derivative and does not easily dissolve the resist material as the lower layer on which a pattern is already formed. This second embodiment is intended, by forming a film on the resist pattern surface with a material obtained through addition of the particular cross linking agent and a resin material known as the resist material to the particular resin composition, to assure excellent affinity with the resist pattern surface with a little dissolution of the pattern surface by reaction of the existing resist material in the film with the relevant resist pattern surface in order to realize that the material explained above can fully show the pattern swelling effect.

After an element region is provided on a semiconductor substrate with the well known method, a silicon oxide film, for example, is formed as an interlayer insulation film on the entire surface with the CVD (Chemical Vapor Deposition) method. Thereafter, a positive resist is formed on the entire surface thereof by the coating process. As the positive resist material, a resist, for example, corresponding to the alicyclic group based ArF excimer laser beam exposure may be used. For example, an acryl based resist having the adamantyl group in the side chain may be used.

After formation of the positive resist film to the entire surface by the coating process, this film is irradiated with the ArF (argon fluoride) excimer laser beam to open a hole pattern on the positive resist. Next, a material containing a phenol resin including the PVP (PolyVinyl Phenol) based negative resist, for example, in the weight ratio of 9:1, a cross lining agent and an interfacial active agent is coated to form a resist pattern swelling film in the manner to cover the entire surface of the positive resist pattern on which the hole pattern is opened. In this case, the well known spin coating is executed for film formation and it is preferable that the film is formed in the thickness of about 1000 Å and more preferably about 2000 Å to 5000 Å. After coating of material with the spin coating method, the resist is baked for 120 seconds at 115° C. and is then developed for 30 seconds with the 0.238%

TMAH (TetraMethyl Ammonium Hydroxide). Thereby, the hole pattern has been reduced (namely, swelling of resist pattern) by about 30 nm.

(Third Embodiment)

Next, as the third embodiment, the third invention of the present invention, namely an embodiment of the resist pattern swelling method or the like will be explained, in which after formation of a resist pattern, the surface of the relevant resist pattern is coated first with an aqueous solution including a non-ionic interfacial active agent, for example, a polyoxyethylene-polyoxypropylene condensation product based interfacial active agent or other agents, thereafter coated with a resin composition selected from polyvinyl alcohol or the like and with a water-soluble composition including a cross linking agent consisting of melamine derivative, urea derivative and uryl derivative. In this example, affinity of the resist pattern surface is previously improved with the aqueous solution including the interfacial active agent and thereafter affinity of the resist pattern surface is improved before coating and formation of the pattern swelling material by coating the resist pattern surface with the water-soluble composition including the particular resin and the particular cross linking agent to realize sufficient swelling effect.

(Fourth Embodiment)

The fourth embodiment depends on the invention of the present invention, namely a resist pattern swelling material constructed by adding the swelling material of the first invention to be coated and formed to cover the surface of resist pattern to a resin composition consisting of at least a kind of resin selected from polyvinyl alcohol, polyvinyl acetal and polyvinyl acetate and to a water-soluble composition including at least a cross linking agent selected from a group of the cross linking agents consisting of melamine derivative, urea derivative and uryl derivative and moreover containing a kind of non-ionic interfacial active agent, for example, a polyoxyethylene-polyoxypropylene condensation product based interfacial active agent. However, this embodiment is different from the first invention in the point that the swelling gent is changed.

The procedures to form a resist pattern on a semiconductor substrate and the process to form a pattern swelling material by the coating are almost similar to the first embodiment. Therefore, the same explanation will be omitted here. As a positive resist material to form a resist pattern, a resist corresponding to the alicyclic group based ArF excimer laser beam exposure is selected. For example, as the alicyclic group resist, those which are well known as the ArF resist, for example, acryl based resist having the adamantyl group in the side chain, COMA-based resist, hybrid (alicyclic group acryl-based and COMA-based copolymer) resist and cyclo-olefin based resist may be used. However, in this example, an alicyclic group acryl based resist is used. The reason why the alicyclic group based resist is used is that this resist has the properties to assure excellent transparency for the ArF excimer laser beam as explained above and also assure higher resolution and dry-etching resistance. Such positive resist film is exposed in the amount of exposure of 30 mJ/cm$^2$ using the ArF excimer laser beam and is then developed to open a hole pattern to the positive resist. Next, a material containing a resin including polyvinyl alcohol and polyvinyl acertal in the weight ratio of 7:3, a cross linking agent and an interfacial active agent is formed by coating process as the resist pattern swelling film to in the manner to cover the entire surface of the positive resist pattern where the hole pattern is opened. In this case, the spin coating method is enough for film formation and the thickness of film is at least about 1000 Å and more preferably about 2000 Å to 5000 Å.

In this case, after coating and formation of the pattern swelling film, thickness is increased by 4% and therefore it can be presumed that swelling of pattern is surely generated. When the amount of exposure is set to 50 mJ/cm$^2$ under the condition that the baking before exposure and the baking after exposure are respectively conducted at 130° C. and 140° C., the thickness of film immediately after the development is increased by 3.5% when the resist is left for two minutes after operation of the resist pattern swelling film. When the baking after exposure is conducted under the same condition as explained above and the resist pattern is left for two minutes after operation of the resist pattern swelling film, the thickness of film is increased by 3.4%.

In addition, when the resist pattern swelling material contains at least a kind of organic solvent among the alcohol based, chain ester based, cyclic ester based, ketone based, chain ether based and cyclic ether based organic solvents in addition to the water-soluble composition or alkali-soluble composition consisting of a resin and a cross linking agent, it is preferable to use the isopropyl alcohol as an example of the alcohol based organic solvent, to use the lactic acid ethyl and propyleneglycolmethylether acetate (PGMEA) as an example of the chain ester based organic solvent, to use the lactone based organic solvent as an example of the cyclic ester based organic solvent. Particularly, the γ-butyloractone (GBL) based organic solvent can be used preferably. As an example of the ketone based organic solvent, the acetone, cyclohexanone or heptanone or the like may be used. As an example of the chain ether based organic solvent, the tetrahydrofurane may be used. Moreover, it is particularly preferable to use an organic solvent having the boiling point of about 80 to 200° C. The organic solvent having such boiling point assures fine drawing of the resist patterns.

Each of the following embodiments shows that the present invention is applicable also to the EB resist, which is designed for Electron Beam Exposure. According to the following embodiments, the resist pattern swelling material of the present invention can be applicable to not only chemical amplified resist but also non-chemical amplified resist. Same effect can be acquired by an application non-chemical amplified resist as well as chemical amplified resist.

(Fifth Embodiment)

Electron Beam patternable conventional type PMMA (polymethyl methacrylate) resist, which is not workable as a chemical amplified resist is employed.

For the above resist, a trench pattern of 130 nm width is patterned by using electron beam exposing apparatus of 50 KeV energy. The solution, which is comprised from polyvinyl acetal (KW-3; Sekisui Chemical Co.) (16), crosslinking agent (uryl) (1), pure water (deionized water) (82.6), and isopropyl alcohol (0.4) (weight ration for each is noted in each corresponding parenthesis) is mingled with the non-ionic interfacial active agent TN-80 (Asahi Denka Co.) (0.25 weight part). This solution is employed as resist pattern swelling material for treating the above Electron Beam patternable conventional type PMMA (polymethyl methacrylate) resist, and thereby pattern swelling width is resulted as 55.2 nm. And also, replacing the weight part of the above non-ionic interfacial active agent TN-80 by 0.0625 weight part, swelling width of the resist pattern is resulted as 28.2 nm in case that such solution having 0.0625 weight part TN-80 is employed as resist pattern swelling material.

(Sixth Embodiment)

Another embodiment employing another EB-patternable conventional type resist, which is not a chemical amplified resist, is exemplified in below. The resist material is comprised from methyl methacrylate-methacrylic acid copolymer (copolymer ratio 9:1). For this resist, trench pattern of 130 nm width is patterned by using electron beam exposing apparatus of 50 KeV energy. When the resist is treated by using resist pattern swelling material having TN-80 as 0.25 weight ratio, which is embodied in the fifth embodiment, the swelling width is resulted as 58.5 nm. And also, when total amount of TN-80 is 0.0625 weight ratio of the resist pattern swelling material, swelling width is resulted as 32.2 nm.
(Seventh Embodiment)

Another embodiment employing another EB-patternable conventional type resist, which is not a chemical amplified resist, is exemplified in below. The resist material is comprised from methyl methacrylate-Methacrylic acid-methacrylic acid chloride copolymer (weight ratio of each material=100:2.2:6). For this resist, trench pattern of 130 nm width is patterned by using electron beam exposing apparatus of 50 KeV energy. When the resist is treated by the resist pattern swelling material exemplified in the fifth embodiment (adding TN-80 0.25 weight ratio), swelling width is resulted as 60.1 nm. And also, when the resist is treated by using the resist pattern swelling material having TN-80 of 0.0625 weight ratio, the resist pattern is swelled 33.7 nm width.

According to the results from the fifth to the seventh embodiments, the resist pattern swelling material of the present invention is applicable to both chemical amplified resist and non-chemical amplified resist.

Some embodiments applying to multilayered EB resist is explained in below as eighth and ninth embodiments. According to the following two embodiments, we can find that the resist pattern swelling material of the present invention is applicable also bi-level or tri-level resist.
(Eighth Embodiment: Application as an EB Bi-Level Resist)

PMMA (polymethyl methacrylate) of 0.15 μm thickness is coated as first resist layer on a substrate, and ZEP-520A of 0.15 μm thickness is coated as second resist layer on the first resist layer. Using this substrate coated first and second resist layer, trench pattern is patterned by using electron beam exposing apparatus of 50 KeV energy. And further, the trench pattern is developed by using MIBK (methyl isobuthyl kethone). As a result of the above, the trench pattern is formed as having 130 nm width. When the above bi-level resist is treated by using the resist pattern swelling material as mentioned in the fifth embodiment, no alteration is occurred in second resist layer of ZEP-520A, but the resist pattern swelling material can work for swelling pattern in first resist layer of PMMA (polymethyl methacrylate). And also, even in case that the resist embodied in the sixth or seventh embodiment is employed as the first layer, same result as aforementioned can be obtained. That is, the first (lower) resist layer is swelled but the second (upper) resist layer is not altered.

Ninth Embodiment: Application as an EB Tri-Level Resist)

PMMA (polymethyl methacrylate) of 0.15 μm thickness is coated as first resist layer on a substrate, and PMGI (polydimethylglutarimide); Micro Lithography Chemical Co. of U.S.A.) of 0.6 μm thickness is coated as second resist layer on the first resist layer, and further ZEP-520A of 0.15 μm thickness is coated as third resist layer on the second resist layer. Using this substrate coated first, second and third resist layers, trench pattern is formed by using electron beam exposing apparatus of 50 KeV energy. The third resist layer (upper layer) is developed by using MIBK (methyl isobutyl keton), and the second resist layer (intermediate layer) is developed by using TMAH solution, and the first resist layer is developed by using MIBK solution. As a result of the above development steps, a trench pattern of 130 nm width is formed. When the resist pattern swelling material of the fifth embodiment is applied to the above resist, no alteration is occurred in the third (upper) resist layer of ZEP-520 A. But the second (intermediate) resist layer of PMGI (polydimethylglutarimide)) is a bit removed through the TMAH treatment, and the first (lower) resist layer of PMMA is swelled as the same as in the above. Moreover, even employing the resist of the sixth or seventh embodiment, only the first (lower) resist layer is selectively swelled, i.e., resist pattern width becomes to be narrower, and thereby the microscopic pattern is completed.

As aforementioned, the resist pattern swelling material of the present invention is applicable also to bi-level or tri-level resist system, and it can acquire the same favorable result as single layer resist system.

Figure 7:
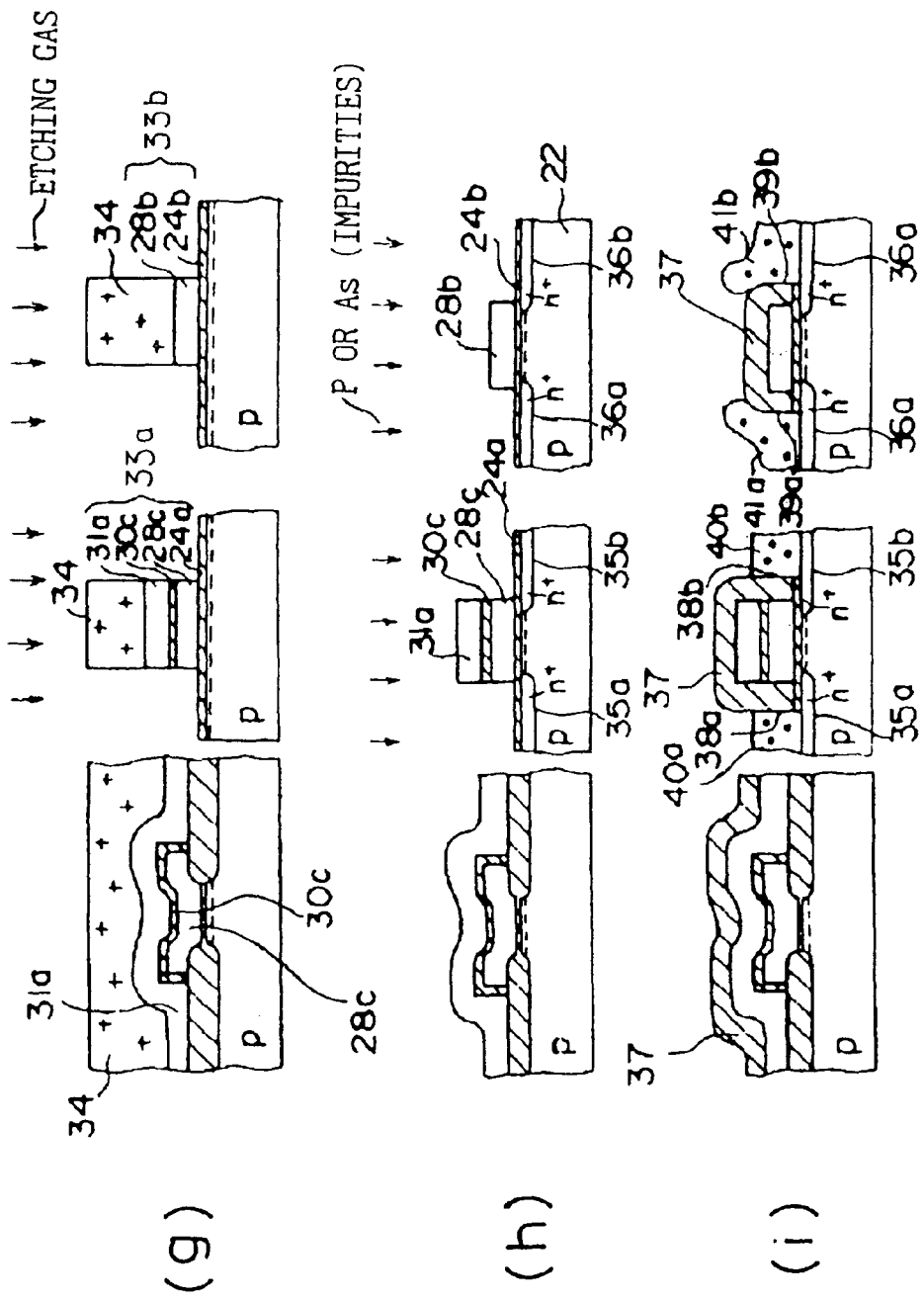
FIG. 7 is cross-sectional views (Part 3) for explaining a method of manufacturing an EPROM as the first embodiment of the present invention.
Figure 8:
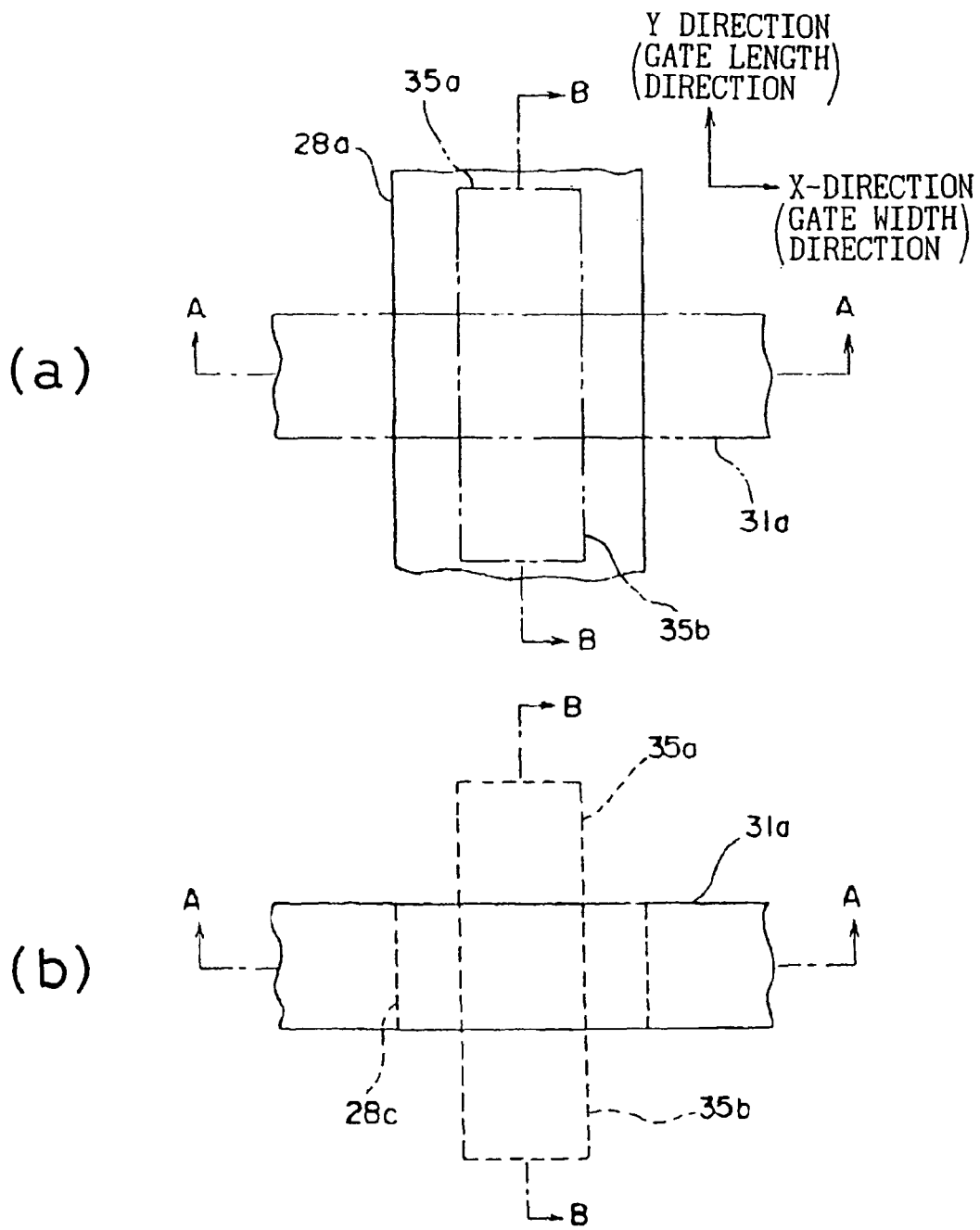
FIG. 8 is plan views for explaining a method of manufacturing an EPROM as the first embodiment of the present invention.

The essential processes of the present invention have been explained above based on a plurality of embodiments thereof, but an outline of flash memory manufacturing processes will then be explained below as an example of the semiconductor device manufacturing processes combining these patterning processes. The internal diameter of hole pattern of resist can be reduced by introducing the resist pattern swelling technique into the hole pattern forming process, moreover an interval between the linear patterns can also be reduced by introducing into the linear pattern forming process and an isolated pattern having the enlarged area can also be provided by introducing into the isolated pattern forming process.
(1) First Application Example FIGS. 5(a) to 5(c), FIGS. 6(d) to 6(f) and FIGS. 7(g) to 7(i) are cross-sectional diagrams for explaining the manufacturing method of a FLOTOX or ETOX type FLASH EPROM as the first application example. The left side diagrams are the cross-sectional views in the gate width direction (X direction) of the memory cell (first element region), namely the part where a MOS transistor having the floating gate electrode is formed, while the center diagrams are the cross-sectional views of the memory cell of the same part as the left side diagrams in the gate length direction (Y direction) in the right angle to the X direction and the right side diagrams are the cross-sectional views of a MOS transistor of the peripheral circuit portion (second element region). Moreover, FIGS. 8(a) and 8(b) show the plan views of FIG. 6(d) and FIG. 7(g). The cross-sectional view along the line A-A of FIG. 8(a) corresponds to the cross-sectional view in the X direction and the cross-sectional view along the line B-B corresponds to the cross-sectional view in the Y direction.

First, as shown in FIG. 5(a), after a field oxide film 23 consisting of $SiO_2$ film is selectively formed in an element isolation region on a p-type Si substrate 22, a first gate insulation film 24a of a MOS transistor of a memory cell portion (first element region) consisting of the $SiO_2$ film in the thickness of 100 to 300 Å and a second gate insulation film 24b of a MOS transistor of the peripheral circuits (second element region) consisting of $SiO_2$ film in the thickness of 100 to 500 Å are formed with the thermal oxidation method in the different processes. Here, the oxide film may be formed simultaneously in the same process on the occasion of forming the first and second gate insulation films 24a, 24b in the same thickness.

Next, in view of forming a MOS transistor having an n-type depletion type channel in the memory cell portion, the peripheral circuit portion is masked with a resist film 26 to control a threshold voltage and a first threshold value control layer 25a is formed by ion implantation of phosphorus (P) or arsenic (As) with the dose of $1 \times 10^{11}$ to $1 \times 10^{14}$ cm$^{-2}$ as the n-type impurity into a region which will become a channel region just under a floating gate. In this case, the dose and conductivity type of impurity are adjusted depending on the depletion type or accumulation type.

Next, in view of forming a MOS transistor having the n-type depletion type channel in the peripheral circuit, the memory cell portion is masked with the resist film 27 to control the threshold voltage and a second threshold value control layer 25b is formed (FIG. 5(b)) by implantation of phosphorus (P) or arsenic (As) in the dose of $1\times10^{11}$ to $1\times10^{14}$ $cm^{-2}$ as the n-type impurity into a region which will become a channel region just under the gate electrode.

Next, a first polysilicon film (first conductive material layer) 28 is formed on the entire surface in the thickness of 500 to 2000 Å which will become a floating gate electrode of the MOS transistor of the memory cell portion and a gate electrode of the MOS transistor of the peripheral circuit portion (FIG. 5(c)).

Next, the first polysilicon film 28 is patterned with the resist film 29 used as a mask to form a floating gate electrode 28 of the MOS transistor of the memory cell portion (FIG. 6(d)). In this case, as shown in FIG. 8(a), the patterning is conducted to set the width in the X direction to the final size, while the patterning is not conducted in the Y direction to keep as it is the covered region which will become the S/D region layer.

Next, after the resist film 29 is removed, the floating gate electrode 28a is covered by the thermal oxidation to form a capacitor insulation film 30a consisting of $SiO_2$ film in the thickness of about 200 to 500 Å. In this case, a $SiO_2$ film 30b is also formed on the first polysilicon film 28 of the peripheral circuit portion. Here, a film of the two to three layers including the $SiO_2$-film/$SiO_3N_4$-film may be formed as a capacitor insulation film. Subsequently, the floating gate 28a and capacitor insulation film 30a are covered to form a second polysilicon film (second conductive material film) 31 in the thickness of 500 to 2000 Å which will become a control gate electrode (FIG. 6(e)).

Next, the memory cell portion is masked with the resist film 32 and the second polysilicon film 31 and the $SiO_2$ film 30b of the peripheral circuit portion are sequentially removed to expose the first polysilicon film 28 (FIG. 6(f)).

The patterning is conducted in the Y direction, using the resist film 32 as the mask, to the second polysilicon film 31, SiO2 film 30b and the first polysilicon film 28a which is patterned only in the X direction of the memory cell portion to provide the final size of the first gate 33a in order to form control electrode 31a/capacitor insulation film 30c/floating gate electrode 28c in the width of about 1 μm in the Y direction. Moreover, the patterning is conducted, using the resist film 32 as the mask, to the first polysilicon film 28 of the peripheral circuit portion to provide the final size of the second gate 33b in view of forming the gate electrode 28b in the width of about 1 μm (FIG. 7(g) and FIG. 8(b)).

Next, the n-type S/D region layers 35a, 35b are formed by ion implantation of phosphorus (P) or arsenic (As) in the dose of $1\times10^{14}$ to $1\times10^{16}$ $cm^{-2}$ to the Si substrate 22 of the element forming region using the control gate electrode 31/capacitor insulation film 30a/floating gate electrode 28a of the memory cell portion as the mask. Moreover, the S/D region layers 36a, 36b are formed by ion implantation of phosphorus (P) or arsenic (As) in the dose of $1\times10^{14}$ to $1\times10^{16}$ $cm^{-2}$ to the Si substrate 22 of the element forming region using the gate electrode 28b of the peripheral circuit portion as the mask (FIG. 7(h)).

Next, the first gate 33a of the memory cell portion and the second gate 33b of the peripheral circuit portion are covered to form an interlayer insulation film 37 consisting of a PSG film in the thickness of about 5000 Å. Thereafter, contact holes 38a, 38b, 39a, 39b are formed to the interlayer insulation film 37 on the S/D region layers 35a, 35b, 36a, 36b and then the S/D electrodes 40a, 40b, 41a, 41b are also formed to complete a FLASH EPROM (FIG. 7(i)).

As explained above, in the first embodiment of the present invention, the capacitor insulation film 30a is formed by covering the pattern of the first polysilicon film 28a of the memory cell portion as shown in FIG. 6(e). Thereafter, the second polysilicon film 31 is formed continuously to the memory cell portion and peripheral circuit portion and this second polysilicon film 31 is patterned in direct to form the first gate 33a consisting of the first gate insulation film 24a/floating gate electrode 28c/capacitor insulation film 30c/control gate electrode 31a as shown in FIG. 7(g).

Therefore, since the capacitor insulation film 30c is always protected, after formation thereof, with the first and second polysilicon films 28a, 31 (FIGS. 6(e) and 6(f)), a high quality capacitor insulation film 30c covering the floating gate electrode 28c can be formed by preventing contamination by particles or the like.

Moreover, since the second insulation film 24b of the peripheral circuit portion is always covered, after formation thereof, with the first polysilicon film 28 (FIG. 5(c) to FIG. 6(f)), the thickness of the second gate insulation film 24b is maintained since it is initially formed. Therefore, thickness of the second gate insulation film 24 can be easily controlled and concentration of the conductive impurity for control of the threshold voltage can also be adjusted easily.

In the first embodiment, in view of forming the first gate 33a, the patterning is conducted in the predetermined width in the gate width direction and thereafter the patterning is also conducted in the gate length direction to obtain the final gate width. However, it is also possible to conduct the patterning first in the gate length direction in the predetermined width and thereafter the patterning is also conducted in the gate width direction to attain the final gate width.

(2) Second Application Example

Figure 9:
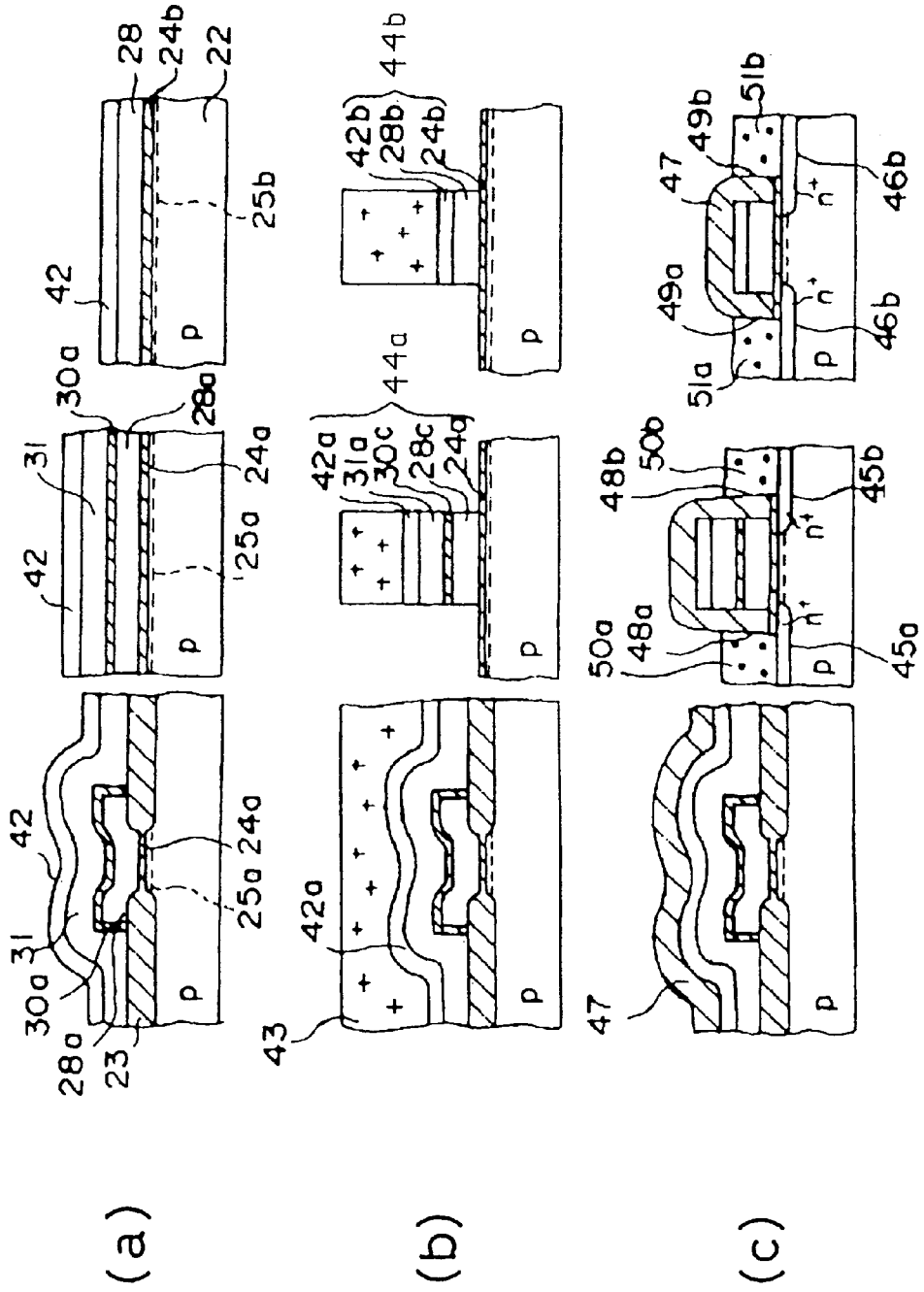
FIG. 9 is cross-sectional views for explaining a method of manufacturing an EPROM as the second embodiment of the present invention.

FIGS. 9(a) to 9(c) are cross-sectional views for explaining a manufacturing method of FLASH EPROM of the FLOTO type or ETOX type as the second application example of the present invention. The left side diagrams show the cross sectional views of the memory cell portions in the gate length direction (X direction) of the part where a MOS transistor having a floating gate electrode is formed. The center diagrams show the cross sectional views of the memory cell portions of the same portion as the left side diagrams in the gate width direction (Y direction) in the right angle to the X direction and the right side diagrams show the cross sectional views of the MOS transistor of the peripheral circuit.

The second application example is different from the first application example in the point that after the process of FIG. 6(f) in the first application example, a refractory metal film (fourth conductive material film) 42 consisting of a W film or a Ti film is formed, for example, in the thickness of about 2000 Å as a polycide film, as shown in FIG. 9(a), on the first polysilicon film 28 of the peripheral circuit and on the second polysilicon film 31 of the memory cell portion. A FLASH EPROM is completed through the similar processes as FIGS. 7(g) to 7(i). Namely, the patterning in the Y direction is conducted to obtain the final size of the first gate 44a using the resist film 43 as the mask to the refractory metal film 42, second polysilicon film 31, $SiO_2$ film 30b and the first polysilicon film 28a which is patterned only in the X direction. Thereby, the control gate electrodes 42a and 31a, capacitor insulation film 30c and floating gate electrode 28c are formed in the width of about 1 μm in the Y direction of the memory cell portion and moreover the pattern is conducted to provide the final size of the second gate 44b using the resist film 42 as the mask to the refractory metal film 42 and the first polysilicon film 28. Thereby, the gate electrodes 42b and 28b are formed in the width of about 1 μm in the peripheral circuit (FIG. 9(b)).

Next, the n-type S/D region layers 45a, 45b are formed by ion injection of phosphorus (P) or arsenic (As) in the dose of $1\times10^{14}$ to $1\times10^{16}$ cm$^{-2}$ on the Si substrate 22 of the element forming region with the control gate electrodes 42a, 31a/ capacitor insulation film 30a/floating gate electrode 28a of the memory cell portion used as the mask and the S/D region layers 46a, 46b are also formed by ion injection of phosphorus (P) or arsenic (As) in the dose of $1\times10^{14}$ to $1\times10^{16}$ cm$^{-2}$ As the n-type impurity on the Si substrate 22 of the element forming region with the gate electrodes 42b and 28b of the peripheral circuit portion used as the mask.

Next, the interlayer insulation film 47 consisting of the PSG film is formed in the thickness of about 5000 Å by covering the first gate 44a of the memory cell portion and the second gate 44b of the peripheral circuit. Thereafter, the contact holes 48a, 48b, 49a, 49b are formed on the interlayer insulation film 47 on the S/D region layers 45a, 45b, 46a, 46b and the S/D electrodes 50a, 50b, 51a, 51b are then formed to complete the FLASH EPROM (FIG. 9(c)). The reference numerals like those of the first application example designate the like elements.

According to the second application example of the present invention, an electrical resistance value can further be reduced by forming the refractory metal films (fourth conductive material films) 42a, 42b on the polysilicon film as the control gate electrodes 42a, 31a and gate electrodes 42b, 28b.

In the second application example, the refractory metal films 42a, 42b are used as the fourth conductive material film on the polysilicon film but a refractory metal film silicide such as titanium silicide (TiSi) may also be used.

(3) Third Application Example

FIGS. 10(a) to 10(c) are cross-sectional views for explaining a method of manufacturing a FLOTOX type or ETOX type FLASH EPROM as the third application example of the present invention. The left side diagram is the cross-sectional view of the memory cell portion in the gate length direction (X direction) of the part where a MOS transistor having the floating gate electrode is formed. The center diagram is the cross-sectional view of the memory cell portion of the same part as the left side diagram in the gate width direction (Y direction) in the right angle to the X direction. The right side diagrams are cross-sectional views of the MOS transistor in the peripheral circuit portion.

The third application example is different from the first application example in the point that the second gate 33c of the peripheral circuit portion (second element region) is also formed, like the first gate 33a of the memory cell portion (first element region), in the construction of the first polysilicon film (first conductive material film) 28b/SiO$_2$ film (capacitor insulation film) 30d/second polysilicon film (second conductive material film) 31b and the first and second polysilicon films 28b and 31b are placed in the short-circuit condition with the method shown in FIG. 10(b) or FIG. 10(c) to form the gate electrode.

Namely, in FIG. 10(b), the opening 52a provided through the second polysilicon film 31b, SiO$_2$ film 30d as the upper layers and the first polysilicon film 28b as the lower layer is formed to the area, for example, on the insulation film 54 which is different from the area where the second gate 33c is formed as shown in FIG. 10(a) and the first and second polysilicon films 28b and 31b are placed in the short-circuit condition by embedding, into the opening 52a, the third conductive material film, for example, the refractory metal film 53a such as W film or Ti film.

Otherwise, in FIG. 10(c), the opening 52b is formed through the second polysilicon film 31b and SiO$_2$ film 30d as the upper layers to expose the first polysilicon film 28b as the lower layer at the bottom part of the opening 52b. Thereafter, the first and second polysilicon films 28b and 31b are placed in the short-circuit condition by embedding, into the opening 52b, the third conductive material film, for example, the refractory metal film 53b such as W film or Ti film.

According to the third application example of the present invention, since the second gate 33c of the peripheral circuit is constructed in the same manner as the first gate 33a of the memory cell, the peripheral circuit portion can be formed simultaneously with formation of the memory cell portion and thereby the manufacturing process can be simplified.

The conductive material film 53a or 53b of the third application example and the fourth conductive material film 42 of the second application example are formed individually, but these can also be formed simultaneously as the common refractory metal film.

A plurality of embodiments of the present invention and examples of the manufacturing process of semiconductor device have been explained above. However, the present invention is not limited to these embodiments and examples and allows various changes and modifications within the scope of the claims thereof.

For example, a non-ionic interfacial active agent may be selected, for example, from a group of the polyoxyethylene-polyoxypropylene condensation product based, polyoxy-alkylenealkylether based, polyoxy-ethylenealkylether based, polyoxyethylene derivative based, sorbitan fatty acid ester based, glycerine fatty acid ester based, primary alcohol ethoxylate based and phenol ethoxylate based interfacial active agents but the compounds other than that listed above, if these are non-ionic interfacial active agents, may be used in the same manner and thereby similar basic effects can also be obtained.

Moreover, as an example of the alicyclic group based ArF resist, the resist corresponding to the exposure with the excimer laser beam of the acryl based ArF having adamantyl in the side chain is used but it may also be replaced with the resist corresponding to the exposure with the excimer laser beam of the acryl based ArF having the norbornane in the side chain and the resist corresponding to the exposure with the excimer laser beam of the COMA cyclo-olefin maleic acid anhydride) based ArF may also be used. Moreover, the resist corresponding to the exposure with the excimer laser beam of the cyclo-olefin based (alicyclic group such as adamantyl or norbornane based) ArF may also be used. In addition, the resist in which a part of the main chain or side chain is formed as fluoride among these resins listed above may also be used. In this case, the resist may more preferably be used for further microscopic process as the resist film corresponding to the F2 excimer laser beam.

A method of manufacturing a semiconductor device has been explained above, but the effect of the present invention can also be obtained by respectively applying the present invention to the devices including the microscopic patterns, for example, the functional components such as mask pattern, reticle pattern, magnetic head, LCD (Liquid Crystal Display), PDP (Plasma Display Panel), SAW (Surface Acoustic Wave) filter, optical components used for connection of optical wiring and microscopic components such as micro-actuator. Moreover, as an example of the semiconductor device, the manufacturing process of a flash memory has been explained above, but the similar effects can also be obtained by applying the present invention to the manufacturing process of logic devices and the manufacturing process of DRAM and FRAM or the like.

The present invention provides the effects that since a swelling pattern can easily be formed exceeding the limit of exposure using the deep ultraviolet ray such as the excimer laser beam (wavelength: 193 nm) of ArF (Argon Fluoride) which enables drawing of the more microscopic patterns, an extremely microscopic pattern can be drawn using the exposure beam in place of use of exposure by electron beam which provides a low throughput and thereby mass-productivity can be maintained for manufacture of devices.

What is claimed is:

1. A method of manufacturing a miniaturized device comprising the steps of:
    forming on a layer to be etched a hydrophobic resist pattern from a polymethyl methacrylate resist as an EB resist or from an alicyclic group acryl based resist as an ArF resist,
    coating a resist pattern swelling material over the surface of the resist pattern,
    swelling the resist pattern by increasing an affinity between the coating formed from the resist pattern swelling material and the underlying resist pattern, without depending upon the cross linking reaction caused through the diffusion of an acid, thereby forming a swelled resist pattern, and
    patterning the layer to be etched with a dry etching method through the swelled resist pattern as the mask,
    wherein the resist pattern swelling material comprises a water-soluble resin composition comprising: at least one resin selected from the group consisting of polyvinyl alcohol, polyvinyl acetal or polyvinyl acetate; at least one cross linking agent selected from a group of the cross linking agents consisting of melamine derivative, urea derivative and uryl derivative; at least one interfacial active agent selected from the group consisting of a polyoxyethylene-polyoxypropylene condensation product based interfacial active agent, a polyoxyalkylene-alkylether based interfacial active agent, a polyoxyethylenealkylether based interfacial active agent, a polyoxyethylene derivative based interfacial active agent, a sorbitan fatty acid ether based interfacial active agent, a glycerine fatty acid ester based interfacial active agent, a primary alcohol ethoxylate based interfacial active agent and a phenol ethoxylate based interfacial active agent; deionized water as a solvent; and at least one organic solvent selected from the group consisting of an alcohol based organic solvent, a chain ester based organic solvent, a cyclic ester based organic solvent, a ketone based organic solvent, a chain ether based organic solvent and cyclic ether based organic solvent, and
    wherein the interfacial active agent is contained in at least 0.0625 parts by weight per 100 parts by weight of a solution containing said resin and said cross linking agent.

2. The method of manufacturing a miniaturized device according to claim 1, characterized in that the resist pattern is the acryl based resist having the alicyclic group functional group in the side chain.

3. The method of manufacturing a miniaturized device according to claim 2, characterized in that the alicyclic group functional group is the adamantyl based functional group or norbornane based functional group.

4. The method of manufacturing a miniaturized device according to claim 1, characterized in that the resist pattern is the COMA (cyclo-olefin maleic acid anhydride) based resist.

5. The method of manufacturing a miniaturized device according to claim 1, characterized in that the device is a semiconductor device.

6. The method of manufacturing a miniaturized device according to claim 5, characterized in that the resist pattern is the cyclo-olefin based resist including the norbornene or adamantane in the main chain.

7. The method of manufacturing a miniaturized device according to claim 5, wherein said resist pattern is formed by patterning a chemical amplified resist.

8. The method of manufacturing a miniaturized device according to claim 5, wherein said resist pattern is a conventional type resist, which is not a chemical amplified resist.

9. The method of manufacturing a miniaturized device according to claim 5, wherein said resist pattern is formed by patterning an Electron Beam exposurable resist.

10. The method of manufacturing a miniaturized device according to claim 5, wherein said resist pattern is comprised from a plurality of resist layers.

11. The method of manufacturing a miniaturized device according to claim 1, wherein said resist pattern is formed by patterning a chemical amplified resist.

12. The method of manufacturing a miniaturized device according to claim 1, wherein said resist pattern is formed by patterning a conventional type resist, which is not a chemical amplified resist.

13. The method of manufacturing a miniaturized device according to claim 1, wherein said resist pattern is formed by patterning an Electron Beam exposurable resist.

14. The method of manufacturing a miniaturized device according to claim 1, wherein said resist pattern is comprised from a plurality of resist layers.

15. A method of manufacturing a semiconductor device comprising the steps of:
    forming on a layer to be etched a hydrophobic resist pattern from a polymethyl methacrylate resist as an EB resist or from an alicyclic group acryl based resist as an ArF resist,
    coating the surface of the resist pattern with an aqueous solution containing at least one interfacial active agent selected from the group consisting of a polyoxyethylene-polyoxypropylene condensation product based interfacial active agent, a polyoxyalkylenealkylether based interfacial active agent, a polyoxyethylenealkylether based interfacial active agent, a polyoxy-ethylene derivative based interfacial active agent, a sorbitan fatty acid ester based interfacial active agent, a glycerine fatty acid ester based interfacial active agent, a primary alcohol ethoxylate based interfacial active agent and a phenol ethoxylate based interfacial active agent, and
    coating a resist pattern swelling material over the surface of the resist pattern,
    swelling the resist pattern by increasing an affinity between the coating formed from the resist pattern swelling material and the underlying resist pattern, without depending upon the cross linking reaction caused through the diffusion of an acid, thereby forming a swelled resist pattern, and
    further coating the surface of the swelled resist pattern with a water-soluble resin composition which comprises: at least one resin selected from the group consisting of polyvinyl alcohol, polyvinyl acetal and polyvinyl acetate; at least a cross linking agent selected from a group of the cross linking agents consisting of melamine derivative, urea derivative and uryl derivative; deionized water as a solvent; and at least one organic solvent selected from the group consisting of an alcohol based organic solvent, a chain ester based organic solvent, a cyclic ester based organic solvent, a ketone based organic solvent, a chain ether based organic solvent and a cyclic ether based organic solvent, and patterning the layer to be etched with a dry etching method through the swelled resist pattern as the mask, wherein the interfacial active agent is contained in at least 0.0625 parts by weight per 100 parts by weight of a solution containing said resin and said cross linking agent.

* * * * *